(12) United States Patent
Ricchetti et al.

(10) Patent No.: US 6,988,232 B2
(45) Date of Patent: Jan. 17, 2006

(54) METHOD AND APPARATUS FOR OPTIMIZED PARALLEL TESTING AND ACCESS OF ELECTRONIC CIRCUITS

(75) Inventors: Michael Ricchetti, Nashua, NH (US); Christopher J. Clark, Durham, NH (US)

(73) Assignee: Intellitech Corporation, Durham, NH (US)

( * ) Notice: Subject to any disclaimer, the term of this patent is extended or adjusted under 35 U.S.C. 154(b) by 410 days.

(21) Appl. No.: 10/119,060

(22) Filed: Apr. 9, 2002

(65) Prior Publication Data

US 2003/0009715 A1    Jan. 9, 2003

Related U.S. Application Data

(60) Provisional application No. 60/303,052, filed on Jul. 5, 2001.

(51) Int. Cl.
G06F 11/00    (2006.01)
(52) U.S. Cl. .................................................. 714/736
(58) Field of Classification Search .................. 714/28, 714/726–729, 733; 326/16
See application file for complete search history.

(56) References Cited

U.S. PATENT DOCUMENTS

| | | | | |
|---|---|---|---|---|
| 5,627,842 | A | 5/1997 | Brown et al. ................ | 114/726 |
| 5,805,610 | A * | 9/1998 | Illes et al. ................... | 714/738 |
| 6,000,051 | A | 12/1999 | Nadeau-Dostie et al. ... | 714/727 |
| 6,018,815 | A * | 1/2000 | Baeg ........................... | 714/726 |
| 6,073,254 | A | 6/2000 | Whetsel ....................... | 714/30 |
| 6,219,289 | B1 * | 4/2001 | Satoh et al. ................. | 365/201 |
| 6,385,749 | B1 * | 5/2002 | Adusumilli et al. ........ | 714/733 |
| 6,408,413 | B1 | 6/2002 | Whetsel ...................... | 714/727 |
| 6,476,628 | B1 * | 11/2002 | LeColst ....................... | 324/765 |
| 6,618,827 | B1 * | 9/2003 | Benavides .................. | 714/726 |
| 6,671,844 | B1 * | 12/2003 | Krech et al. ................ | 714/736 |

FOREIGN PATENT DOCUMENTS

EP    0 417 905 A2    3/1991

OTHER PUBLICATIONS

*XC1700 and XC18V00 Design Migration Considerations*, Chris Borelli and Randal Kuramoto, XILINX, XAPP161 (v3.1) Jun. 10, 2002, www.xilinx.com, pp. 1-9.
*Configuring Spartan-II FPGAs from Parallel EPROMs*, XILINX, XAPP178 (v0.9) Dec. 3, 1999, www.xilinx.com, pp. 1-9.
*SN54LVT8996, SN74LVT8996 3.3-V 10-Bit Addressable Scan Ports Multidrop-Addressable IEEE STD 1149.1 (JTAG) TAP Transceivers*, scbs686a-Apr. 1997, Revised Dec. 1999, Texas Instruments Incorporated, pp. 1-41.

(Continued)

*Primary Examiner*—Shelly Chase
(74) *Attorney, Agent, or Firm*—Weingarten, Schurgin, Gagnebin & Lebovici LLP

(57) ABSTRACT

An architecture that provides stimulus data and verifies the response of multiple electronic circuits substantially in parallel for optimized testing, debugging, or programmable configuration of the circuits. The architecture includes a test bus, a primary test controller connected to the bus, and a plurality of local test controllers connected to the bus, in which each local test controller is coupleable to a respective circuit. The primary test controller sends stimulus data and expected response data over the bus to the respective local test controllers to perform parallel testing, debugging or programmable configuration of the circuits. Each local test controller applies the stimulus data and verifies the circuit response against the expected response data. Further, each local test controller stores the result of the verification for later retrieval by the primary test controller.

75 Claims, 12 Drawing Sheets

*Parallel Test Architecture 500*

OTHER PUBLICATIONS

*SCANPSC110F SCAN Bridge Hierarchical and Multidrop Addressable JTAG Port (IEEE1149.1 System Test Support)*, National Semiconductor Corporation, Oct. 1999, pp. 1-29.

*P1149.4/d26 Draft Standard for a Mixed-Signal Test Bus*, Mixed-Signal Working Group of the Test Technology Technical Committee of the IEEE Computer Society, 1999, pp. 1-123.

*IEEE P1149.1/D2001.9 Draft Standard Test Access Port and Boundary-Scan Architecture*, Jan. 19, 2001, Institute of Electrical and Electronics Engineers, Inc., pp. 1-227.

"Addressable Test Ports An Approach to Testing Embedded Cores" Lee Whetsel © 1999 IEEE, pp. 1055-1063.

* cited by examiner

METHOD AND APPARATUS FOR OPTIMIZED PARALLEL TESTING AND ACCESS OF ELECTRONIC CIRCUITS

CROSS REFERENCE TO RELATED APPLICATIONS

This application claims priority of U.S. Provisional Patent Application No. 60/303,052 filed Jul. 5, 2001 entitled METHOD AND APPARATUS FOR OPTIMIZED PARALLEL TESTING AND ACCESS OF ELECTRONIC CIRCUITS.

STATEMENT REGARDING FEDERALLY SPONSORED RESEARCH OR DEVELOPMENT

N/A

BACKGROUND OF THE INVENTION

The present invention relates generally to scan-based testing of integrated circuits, printed circuit boards, and systems, and more particularly to a method and apparatus for accessing multiple such electronic circuits within a system and for optimized testing of multiple such electronic circuits in parallel.

Scan-based testing is frequently employed during the development and manufacturing of electronic components (e.g., Integrated Circuits (ICs)) and systems (e.g., Printed Circuit Boards (PCBs) and Systems On a Chip (SoC) for detecting and diagnosing defects and for debugging. This test method is commonly referred to as "scan" because the state elements of the circuits are configured to form a serial shift (i.e., scan) register, often called a scan path or scan chain, during a test mode of operation. Scan test typically involves serially shifting data into (scan-in) and out of (scan-out) the scan path(s) of a Unit Under Test (UUT) as a way of applying digital logic values as test stimulus and capturing digital logic values in response to the test stimulus. The responses are normally compared against expected scan out data, and any failure during the data comparison generally indicates detection of a defect in the UUT. Thus, for a digital circuit, the scan test mode provides full controllability and observability of inputs and outputs of combinational logic included in the UUT. This greatly simplifies the test problem and provides for high quality tests with overall reduced costs.

Providing serial scan access enables "visibility" into a UUT for test and debug purposes by providing a way of observing/controlling the circuit states without the need for physical probing. Without scan, internal nodes of the circuit would only be accessible through the physical pins of the UUT. In this case, any testing or debugging of the circuit would require applying complex sequences of operations to provide control/observation of the internal states. A UUT with scan can also be used to access other circuits connected to the UUT, e.g., circuits embedded within the UUT such as embedded memories and cores or other circuits connected externally to the UUT. This approach is often employed to access external memories for the purpose of programming their contents, e.g., programming FLASH memory from the Boundary Scan path of an IC connected to the FLASH memory.

Scan access is typically performed in accordance with the IEEE 1149.1 Standard Test Access Port and Boundary Scan Architecture specification, which is incorporated herein by reference. This standard was developed primarily to solve the problems of PCB testing. The IEEE 1149.1 Standard utilizes a Boundary Scan path to facilitate access to the I/O pins of devices mounted on the PCB. In addition, the IEEE 1149.1 Standard can be used to access scan paths within an IC to facilitate test, debug, and in-system configuration of ICs, PCBs, and systems.

FIG. 1 illustrates the conventional IEEE 1149.1 Boundary Scan Architecture 100. As shown in FIG. 1, an IC compliant with the IEEE 1149.1 Boundary Scan Architecture 100 has four (optionally, five) additional component pins called Test Clock (TCK), Test Mode Select (TMS), Test Data Input (TDI), and Test Data Output (TDO) (and optionally Test Reset (TRSTN)). These dedicated test pins are commonly referred to as the Test Access Port (TAP). Additionally, IEEE 1149.1 compliant ICs implement three scan registers—an Instruction Register (IR) 102 and two standard Data Registers (DRs) called a Bypass Register 104 and a Boundary Scan Register (BSR) 106. FIG. 1 also shows a User DR 108, which the IEEE 1149.1 Standard permits designers to implement to support additional test and debug features in the architecture 100 such as internal scan paths and Built-In Self-Test (BIST).

In the IEEE 1149.1 Standard, the five TAP pins have the following functions:

TCK is an input signal that is provided to synchronize the execution of various test actions, both within the individual IC components and among multiple IC components being accessed through the TAP. TCK is a periodic clock signal, which is generally free running with a constant frequency. However, TCK may be started or stopped, or its frequency may be changed, depending on the application. Most test actions take place on the rising-edge of the TCK pulse but certain actions occur only on the falling-edge of TCK.

TMS is an input pin that is used to control the internal state of a TAP Controller 110 (see FIG. 1). The TAP Controller 110 is a 16-state Finite State Machine (FSM) that provides a standard IEEE 1149.1 protocol for accessing functions within the architecture 100. Certain actions defined by the IEEE 1149.1 Standard are permitted, and can be executed, only in specific TAP Controller states. TMS values are sampled on the rising-edge of TCK.

TRSTN is an input signal that provides asynchronous reset of the TAP Controller 110, which brings it into the Test-Logic-Reset state to allow the IC component to execute its mission function. Regardless of the state of the TCK and TMS inputs, the target TAP Controller enters and remains in the Test-Logic-Reset state as long as TRSTN is at a logic value of 0. Since it is also possible to reset the TAP Controller 110 by setting TMS to the logic 1 value for at least 5 TCK periods, TRSTN has been defined as an optional input signal.

TDI is an input signal that provides serial scan-in data to the device. TDI receives test data from another device's TDO, or from an external test resource such as a scan controller or Automatic Test Equipment (ATE). The logic value of the signal on TDI is sampled on the rising-edge of TCK.

TDO is the serial scan-out from the device. When a device is enabled to scan data, its TDO transmits test data to another device's TDO, or back to the test apparatus. Scan-out values on the TDO output change with the falling-edge of TCK.

The IEEE 1149.1 Standard facilitates connecting the TAP ports of multiple components together to form an IEEE 1149.1 bus, which allows the connected circuits to be accessed with a common TAP protocol. This is typically achieved by connecting the serial data terminals, TDI and TDO, of the individual devices in a daisy chain fashion such that the TDO output from the previous device along the chain is connected to the TDI input of the next device in the chain. Then, by connecting all of the individual TMS, TCK (and optionally TRSTN) signals of the devices in common, an overall TAP bus is formed.

A typical daisy chained configuration 200 of the IEEE 1149.1 bus is depicted in FIG. 2. As shown in FIG. 2, the TDI input on a first device 202.1 (UUT1) and the TDO output on a last device 202.n (UUTn) are used as the serial data input and serial data output of the bus, respectively. Given the bussed configuration 200 shown in FIG. 2, the test apparatus can connect to the TDI, TDO, TMS, TCK and TRSTN of the bus and communicate with the devices 202.1–202.n using the IEEE 1149.1 TAP protocol.

The daisy chained configuration 200 of FIG. 2 can be used on a single PCB. However, a different approach is often used when the TAP bus is extended across multiple PCBs on a system backplane. In this case, implementing the daisy chained TDI/TDO configuration 200 of FIG. 2 along the backplane may be impractical because the scan chain would be disconnected if any board is unplugged. In addition, the overall configuration (e.g., the total length of the scan chain) may change as different types of boards are added or removed. This makes it difficult for the test apparatus to communicate with the individual boards so that they may be properly identified and tested. Consequently, the complexity of implementing a single serial chain across a system backplane has led to the development and use of a configuration of the IEEE 1149.1 TAP bus commonly referred to as the multi-drop bus architecture.

As shown in FIG. 3, a conventional multi-drop configuration 300 of the IEEE 1149.1 bus can be used to provide a single TAP bus across a backplane to allow each board 302.1–302.n to make connections to the same set of wires on the bus, i.e., in parallel. Because TCK, TMS, TDI and the optional TRSTN are input signals, they can be connected across the system backplane to each of the TAPs of the individual boards 302.1–302.n directly. However, care is taken to prevent signal clashes that may result due to connecting the multiple TDO outputs onto the single TDO wire of the multi-drop bus. This is possible as the IEEE 1149.1 Standard requires that the TDO output shall drive out only when serial data is being shifted into/out of the TAP's TDI-TDO pins. This is controlled by the internal states of the TAP Controller 110 (see FIG. 1) so that serial-shift is enabled only during the Shift-IR or the Shift-DR states of the TAP FSM. At all other times, the TDO output is disabled by forcing it into an inactive or high-impedance state.

However, when using the multi-drop configuration 300, all TAP Controllers receive the same set of input signals and therefore operate in lock step with each other. That is, all of the TAP Controller's FSMs are in the same state such that, unless certain changes are made to the architecture, enabling the TDO output from any TAP Controller (e.g., during the Shift-DR state) also enables the TDO output from all other TAP Controllers. In addition, because all TAP Controllers operate in lock step and receive the same input data values (i.e., from the commonly bussed TDI), it is difficult to perform different test actions on the different boards 302.1–302.n without special consideration in the architecture.

Controlling the multi-drop configuration 300 of the IEEE 1149.1 bus usually requires the use of a customized version of the TAP controller and a special protocol to communicate with it. Further, the TAP controller and protocol is generally used with each device or board that interfaces to the multi-drop bus. The multi-drop configuration 300 necessitates the ability to address the TAP controllers on the bus so that a single TAP controller drives its TDO output only after it has been uniquely selected. When unselected, the TAP controllers still receive the TDI input and operate in lock step, but do not enable their TDO outputs to drive onto the multi-drop bus.

Current solutions for parallel testing or configuration of programmable circuits include employing a "ganged access" or "scan multiplier" configuration of the UUTs. A conventional ganged access scan multiplier configuration 400 using the IEEE 1149.1 bus is shown in FIG. 4. With this configuration, inputs to UUTs 402.1–402.n (i.e., TDI, TMS, TCK and TRSTN) are bussed in parallel, while scan outputs from each UUT 402.1–402.n (i.e., TDO) are individually connected to a multiplexing controller 408. Thus, a dedicated TDO line for each UUT 402.1–402.n on the bus is generally required. For applications that require a high degree of parallel testing, this would require a large number of TDO signals connected from the UUTs 402.1–402.n back to the multiplexing controller 408. So, for example, if it is desired to connect one hundred UUTs in this configuration 400, one hundred separate TDO lines (one per UUT) would be routed back to a TDO select circuit 406. The purpose of the multiplexing controller 408 is to allow a simple interface with a general-purpose IEEE 1149.1 controller 404 having just the 4 or 5 standard TAP controller pins, as shown in FIG. 4.

With the approach of the ganged access scan multiplier configuration 400, the IEEE 1149.1 controller 404 provides the TAP protocol to all UUTs 402.1–402.n in parallel, and therefore all UUTs 402.1–402.n receive the same TAP instructions and test data. Further, as shown in FIG. 4, the multiplexing controller 408 can only select a single TDO output from one of the UUTs to connect back to the IEEE 1149.1 controller 404. Thus, the gang access scan multiplier configuration 400 can send scan-in test data on the common TDI of the bus to all of the UUTs 402.1–402.n in parallel, but receives scan-out test data on TDO from only one UUT at a time. This approach may reduce the time required to program multiple devices, however it does not speed up operations that require checking the scan-out test data from the TDO outputs of the respective UUTs. So, for example, verifying the programmed contents of FLASH memories on the UUTs would require reading back and checking the contents of each FLASH memory individually, i.e., one at a time. Any other operations that require polling or checking status suffer a similar penalty. For testing purposes, the TDO scan out is checked on each UUT for each bit of scan out. So, clearly there is little advantage to this approach over serial testing of the UUTs. Accordingly, the conventional gang access scan multiplier configuration 400 is not an optimal solution for parallel testing.

The use of Design For Testability (DFT) techniques by engineers—including implementation of IEEE 1149.1 Boundary Scan, internal scan, and Built-In Self-Test (BIST) —has increased considerably as ICs, PCBs, and systems have become more complex. This increased use of DFT has provided for high quality tests, reduced test times and test costs, reduced debug effort, and reduced time to market. However, as electronic circuits continue to grow in complexity, test continues to be a challenge and may become a major bottleneck in the design and manufacture of high technology electronic systems. Examples of technologies that are contributing to increased design complexity and therefore must be dealt with during test and debug, include embedded cores, embedded memory, analog/mixed-signal applications, and In-System Configuration (ISC) of programmable logic (e.g., CPLDs and FPGAs) and nonvolatile memories (e.g., FLASH memories). Further, a growing market demand for such products, in addition to increased competition in the market place, continue to place pressure on manufacturers of electronic systems to reduce costs and improve time to market. Thus, new methodologies that both reduce costs and minimize the time required for testing, debugging, and configuration of complex ICs, PCBs, and systems are needed.

BRIEF SUMMARY OF THE INVENTION

In accordance with the present invention, a Parallel Test Architecture (PTA) is provided that facilitates simultaneous access to multiple electronic circuits (i.e., in parallel) for optimized testing and/or debugging purposes, or for the configuration of programmable circuits. In one embodiment, the PTA comprises a Parallel Test Bus (PTB), a test controller connected to the PTB, and a plurality of addressable PTB controllers connected to the PTB, in which each addressable PTB controller is coupleable to a respective electronic circuit to be accessed. In the presently disclosed embodiment, the test controller is configured to send at least one control signal over the PTB to respective addressable PTB controllers to initiate parallel scan access of the electronic circuits coupleable thereto by the respective addressable PTB controllers. Further, each addressable PTB controller is configured to employ a scan protocol to access the respective electronic circuit coupleable thereto based on the at least one control signal sent over the PTB by the test controller, and send resultant scan data over the PTB to the first controller in response to accessing the respective electronic circuit.

The electronic circuits may comprise any circuit including an IC die fabricated on a silicon wafer, packaged ICs, PCBs, or circuits within a system. The PTA enables access to all such electronic circuits in parallel to allow a test apparatus to test or program any number of circuits of the same type in parallel.

The presently disclosed parallel test architecture reduces costs associated with testing of electronic circuits and configurations of programmable logic devices and memories. With the PTA, the cost of Automatic Test Equipment (ATE) is greatly reduced, as the test apparatus required to control the PTA can be implemented by a low-cost system such as a Personal Computer (PC) or a Unix-based workstation instead of a full-function ATE. In addition, costs are reduced because the PTA can test or program multiple circuits in parallel, thereby minimizing testing and programming times. The PTA also provides for ease of scalability over traditional ATE. Typically, ATE is limited to testing a single UUT or only a few devices in parallel. Further, scalability of traditional ATE is often impractical, as it is costly to add resources (e.g., tester channels and vector memory) or utilize additional ATE to provide increased "parallel" testing of multiple UUTs.

The PTA is configured to provide true parallel testing of multiple UUTs. It is capable of testing or verifying a number of UUTs simultaneously, i.e., in parallel, rather than one at a time. With the PTA, the speed-up in test time over that of serial testing is equal to the number of UUTs that are connected and tested in parallel. The PTA solves numerous problems of conventional test architectures such as the problem of requiring separate TDO lines for each UUT. This makes it possible for PTA to be practically implemented and used for a variety of applications. For instance, the PTA can be implemented separately from the devices or UUTs, or it can be implemented together with the UUTs as a part of a final system configuration. For example, in the case of chip testing at wafer probe, the PTA can be implemented as part of a tester or probe interface card. Further, the PTA can be implemented on each of the PCBs that plug into a system backplane. It is also possible to implement the PTA within an IC, e.g., to provide parallel test where the UUTs are embedded cores within an SoC.

The PTA makes use of an enhanced test controller and protocol for communicating with the UUTs. The test controller itself may be externally connected to the UUTs, or it may be a master test controller embedded in a system containing the UUTs (e.g., a master controller device on a PCB board) or embedded within in an IC (e.g., a master controller core) in the system. The external test controller may be a general-purpose computer or PC with the appropriate application software.

The presently disclosed parallel test architecture provides a low-cost optimal solution to parallel testing of electronic circuits and/or configuration of programmable circuits. It can be implemented in a variety of ways appropriate to the application use. Further, the PTA supports any number of DFT methodologies for testing of the UUT, e.g., Boundary Scan, internal scan, and BIST.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

U.S. Provisional Patent Application No. 60/303,052 filed Jul. 5, 2001 is incorporated herein by reference.

Figure 5:
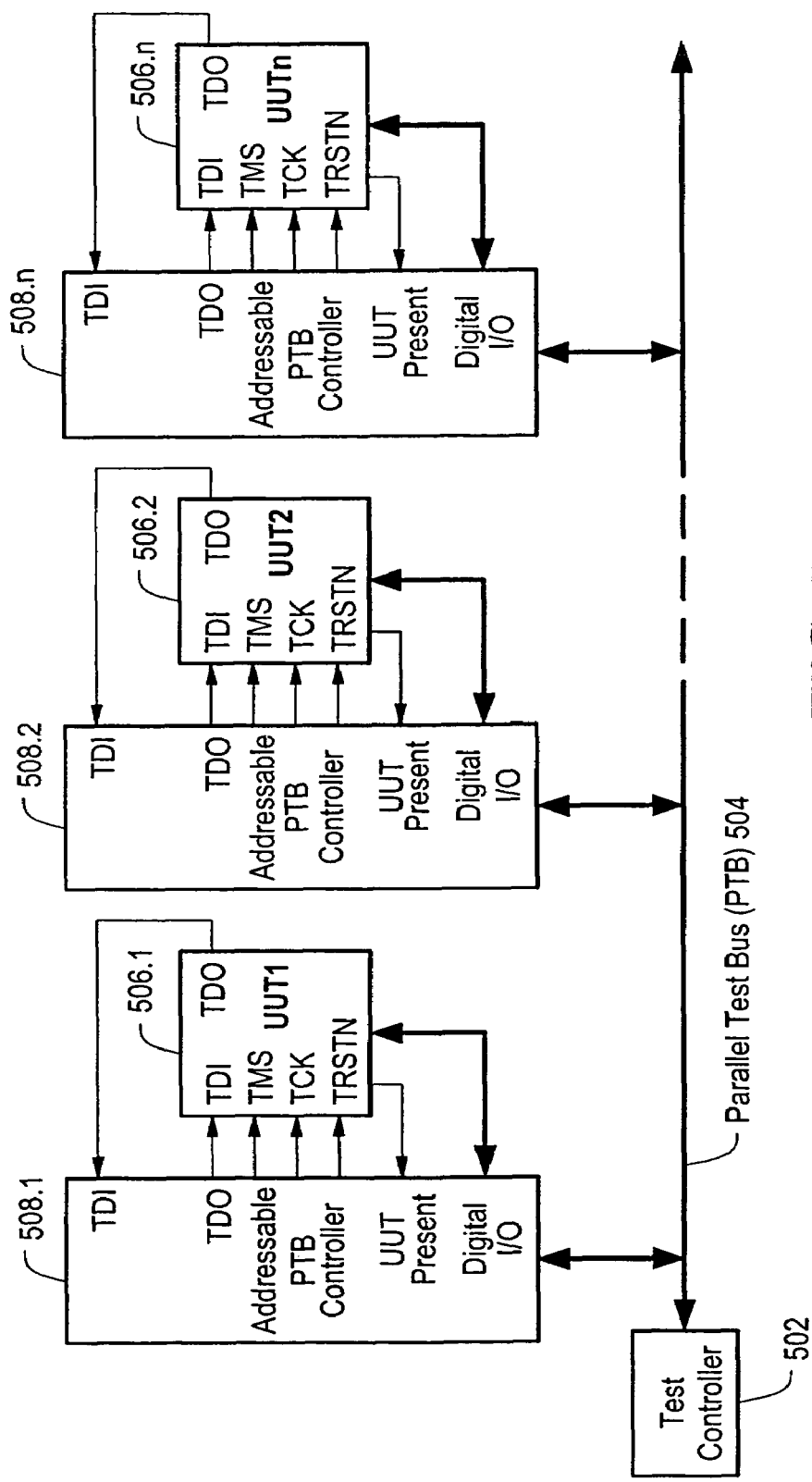
FIG. 5 is a block diagram depicting a parallel test architecture according to the present invention.

FIG. 5 depicts an illustrative embodiment of a Parallel Test Architecture (PTA) 500, in accordance with the present invention. In the illustrated embodiment, a test controller 502 is connected to a Parallel Test Bus (PTB) 504. For example, the test controller 502 may be either a separate external test controller or an embedded master controller, e.g., embedded with the system including Units Under Test (UUTs) 506.1–506.n. The test controller 502 is configured to communicate over the PTB 504 using the protocol of the PTA 500, which is described below. In this illustrated embodiment, the UUTs 506.1–506.n are connected to the PTB 504 via respective addressable PTB Controller circuits 508.1–508.n. Further, the PTA 500 may have from 1-n UUTs connected to the PTB 504. Any suitable number of like UUTs may then be accessed in parallel for testing and/or debugging purposes, or for the configuration of programmable circuits. Alternatively, respective UUTs may be accessed individually.

For example, the test controller 502 may comprise a general-purpose computer or PC including at least one memory such as Read-Only Memory (ROM) and Random Access Memory (RAM) for storing data, operating systems, and application software modules for testing, debugging, or programmably configuring the UUTs 506.1–506.n, and at least one processor for controlling the respective PTB Controller circuits 508.1–508.n via the PTB 504 and executing electronic circuit testing/debugging/configuration applications.

The PTB 504 facilitates communication between the test controller 502 and the UUTs 506.1–506.n via the respective addressable PTB Controller circuits 508.1–508.n. It is noted that the PTB Controller may be implemented in a variety of ways. For example, the PTB Controller may be implemented as a single device, i.e., separate from the UUTs 506.1–506.n and the test controller 502. Alternatively, the PTB Controller may be implemented as a number of discrete devices, e.g., mounted on a PCB or embedded as part of a UUT.

In the illustrated embodiment, each PTB Controller 508.1–508.n handles local communications with a respective UUT 506.1–506.n. The protocol used to communicate locally between the PTB Controller and the UUT connected thereto is the standard IEEE 1149.1 protocol. Accordingly, a PTA system may be configured and implemented such that existing UUTs can interface directly to the standard IEEE 1149.1 interface of the PTB Controllers.

Further details of the PTB 504, the PTB Controller 508.1–508.n, and the PTA protocol and operation are explained in the sections that follow.

Parallel Test Bus (PTB)

Figure 6:
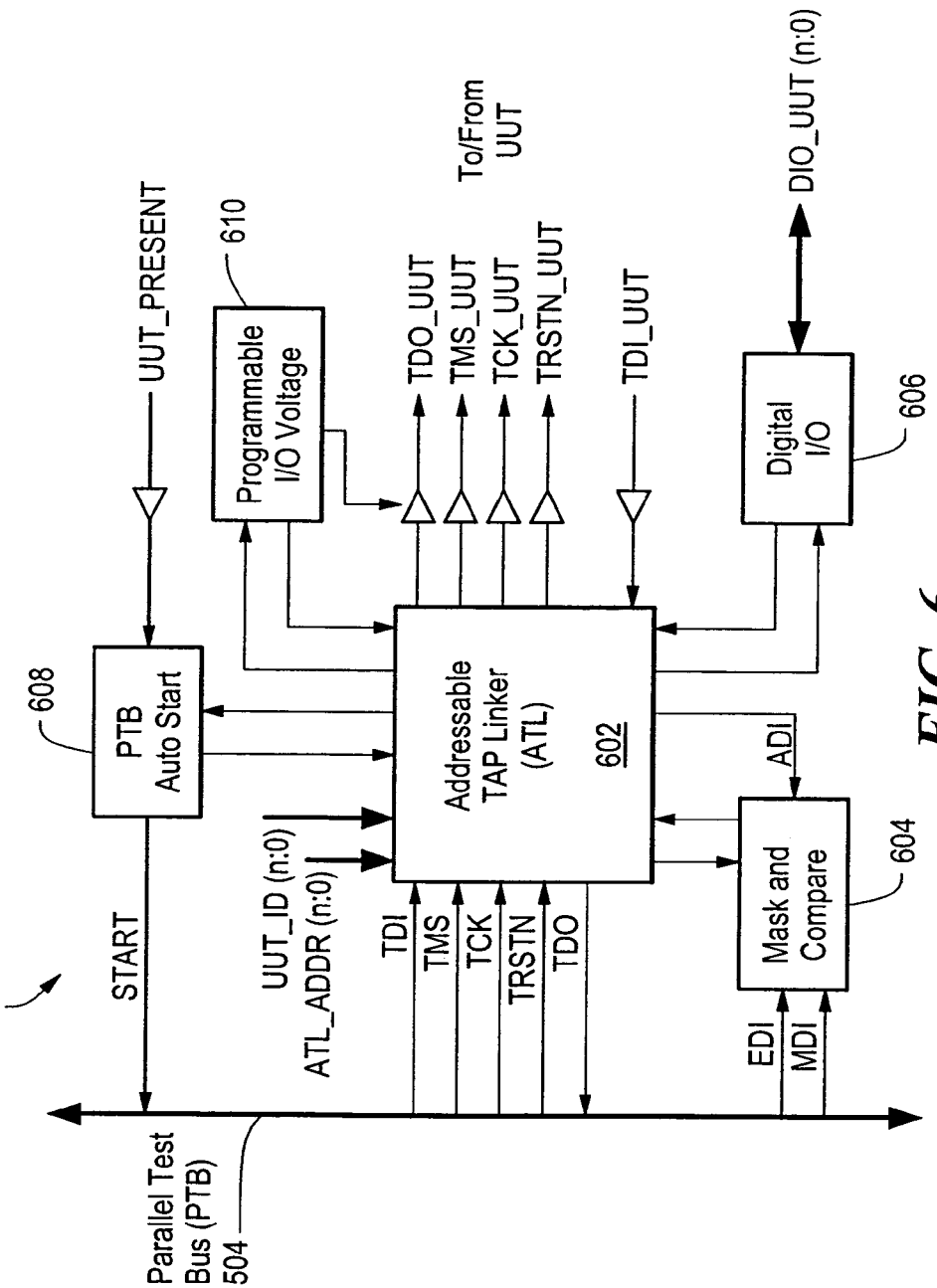
FIG. 6 is a block diagram depicting a parallel test bus controller included in the parallel test architecture of FIG. 5.

FIG. 6 depicts an exemplary Parallel Test Bus (PTB) controller 508 connected to the PTB 504 (see FIG. 5). In the illustrated embodiment, the PTB 504 comprises an extended multi-drop TAP bus. As shown in FIG. 6, the PTB 504 has the standard IEEE 1149.1 signals—TCK, TMS, TDI, TDO and TMS. In addition, the PTB 504 includes Expected Data In (EDI) and Mask Data In (MDI) signals.

The EDI and MDI signals are provided to allow the PTA 500 to check and verify scan-out data for all of the UUTs 506.1–506.n in parallel. Accordingly, the test controller 502 and the PTA protocol are operative to provide the expected scan-out data on the EDI signal of the PTB 504, which can then be compared against the actual TDO data coming from the UUTs 506.1–506.n.

In addition, the test controller 502 is configured to provide a mask for the expected TDO data on the MDI signal of the PTB 504. This is so that any expected TDO data specified to be an "X" (i.e., an indeterminate or unknown logic value) for the UUTs 506.1–506.n can be masked or ignored during the checking of the scan-out data. Accordingly, the EDI and MDI signals in the PTA 500 allow the checking of the UUT's TDO data to be done locally, i.e., by each of the respective PTB Controllers 508.1–508.n rather than by the test controller 502.

As a result of utilizing the multi-drop bus configuration for the PTB 504, the PTA 500 provides an optimal way of testing multiple UUTs in parallel. Utilizing the multi-drop PTB 504, the PTA 500 does not require separate TDO lines for each UUT because the TDOs are connected in parallel to the PTB Controllers 508.1–508.n. This eliminates a significant number of wires in the connections to the UUTs 506.1–506.n. Further, the inclusion of the EDI and MDI signals on the PTB 504 permits a distributed checking approach for scan-out data, in which all of the UUTs 506.1–506.n can be tested simultaneously.

Although the TDOs are bussed in parallel, the PTB 504 supports communication to a single selected UUT and can receive the actual TDO data back from the selected UUT, if desired. So, for example, the test controller 502 may be used to perform debug or repair of the selected UUT. Further, the implementation of the PTB 504 can be adapted and optimized according to the particular test application. For example, in the case of wafer probe, the PTB 504 can be implemented within an ATE, i.e., separate from the die to be tested in parallel. Alternatively, the PTB 504 can be implemented together with the UUTs 506.1–506.n in a final system configuration, e.g., along with the system backplane. It should be noted that the PTA 500 including the PTB 504 may be configured to support or use other scan protocols and/or methodologies instead of the IEEE 1149.1 scan methodology described above.

Addressable PTB Controller

FIG. 6 depicts the exemplary PTB Controller 508. As shown in FIG. 6, the PTB Controller 508 includes an Addressable TAP Linker (ATL) 602, which provides for addressing and selecting the PTB Controllers 508.1–508.n on the PTB 504 and controls scan access to the UUTs 506.1–506.n (see FIG. 5). It is noted that the ATL circuit 602 may be used in multi-drop scan bus applications as a standalone implementation, i.e., separate from the PTB Controller 508, where parallel test capability is not required. In the illustrated embodiment, there is one ATL 602 connected to the PTB 504 per UUT. Accordingly, the multiple PTB Controllers 508.1–508.n can be connected to the PTB 504, and in turn, each of the respective ATLs in the PTB Controllers 508.1–508.n can interface to a single UUT and to the PTB 504. The PTB Controller circuit 508 further includes a Mask and Compare circuit 604, a Digital I/O (DIO) circuit 606, a PTB Auto Start circuit 608, and a Programmable I/O Voltage circuit 610. Each of the functional blocks of the PTB Controller 508 is described below.

Addressable TAP Linker

As shown in FIG. 6, the ATL 602 connects to the PTB 504 via the standard IEEE 1149.1 signals TCK, TMS, TDI, TDO and TMS. This connection to the multi-drop PTB bus 504 is used by the test controller 502 to communicate with the ATL 602 and the other circuits 604, 606, 608, and 610 included in the PTB Controller 508 using the PTA protocol. Further, the ATL 602 interfaces with a respective UUT (not shown) and to the other circuits 604, 606, 608, and 610 of the PTB Controller.

On the UUT side, the ATL 602 interfaces with a TAP bus of the UUT. The ATL outputs signals TDO_UUT, TMS_UUT, TCK_UUT and TRSTN_UUT to the UUT. These signals connect to the corresponding TAP inputs of the UUT (e.g., the TDO_UUT output connects to the TDI input of the UUT). Further, the ATL 602 has a TDI_UUT input signal, which connects to the TDO output of the UUT. In the PTA 500 (see FIG. 5), the test controller 502 utilizes this ATL interface to the UUT's TAP to manage the IEEE 1149.1 protocol between the UUTs 506.1–506.$n$ and the PTB Controllers 508.1–508.$n$ on the PTB 504. The ATL 602 controls the UUT TAPs based on the PTA protocol and whether or not the UUTs 506.1–506.$n$ are being accessed in parallel or a specific UUT connected to the ATL 602 is being accessed by itself (e.g., to examine a particular UUT's TDO data on the PTB 504). In the illustrated embodiment, the ATL 602 also interfaces to the mask and compare circuit 604, the digital I/O circuit 606, the PTB Auto Start circuit 608, and the programmable I/O voltage circuit 610.

The ATL 602 provides a number of features for addressing and selecting UUTs, as described below.

Addressing and Selecting UUTs

As shown in FIG. 6, the ATL 602 receives inputs on the ATL_ADDR[n:0] bus and on the UUT ID[n:0] bus. These inputs enable the test controller 502 (see FIG. 5) to address and select the UUTs 506.1–506.$n$ connected to the respective PTB Controllers 508.1–508.$n$ via the PTB 504.

In the illustrated embodiment, all of the PTB Controllers 508.1–508.$n$ connected to the PTB 504 implement an n+1 bit ATL Address, which is input to the ATL 602 on the ATL_ADDR[n:0] lines. The ATL Address is configured such that each of the PTB Controllers 508.1–508.$n$ on the PTB 504 can be assigned a unique address. This address enables the test controller 502 to uniquely address and select one of the PTB Controllers 508.1–508.$n$ on the multi-drop PTB 504. For example, if a PTB were configured to support up to 16 UUTs, then at least a 4-bit ATL Address would be implemented such that there are ATL_ADDR[3:0] inputs to provide up to 16 unique ATL Addresses.

The UUT ID, which is input to the ATL 602 on the UUT_ID[n:0] lines, is used to provide UUT identification data to the test controller 502 for the UUTs 506.1–506.$n$ connected to the respective PTB Controllers 508.1–508.$n$ in the PTA 500. In the illustrated embodiment, the UUT ID provides the UUT Type and, optionally, the UUT Version, UUT Manufacturer, and/or other data used to identify the UUT. If a PTA implementation is such that all UUTs are of the same type and version, then the UUT_ID[n:0] inputs to the ATL 602 may not be required. In this case, the ATL 602 may be configured without these inputs, or the UUT_ID[n:0] lines can be tied to some predetermined or default logic value. Where multiple types (or versions) of UUTs are implemented in the same PTA, the UUT ID is configured such that all UUT Types supported can have a unique assignment. The UUT ID enables the test controller 502 to address and select UUTs of the same type, version, etc., simultaneously, i.e., as a group.

As described above, the ATL Address and UUT ID allow for addressing and selecting one or more UUTs, depending on the addressing mode used by the test controller 502. In the illustrated embodiment, the ATL 602 supports the following addressing modes:

ATL Address Mode—This addressing mode uniquely selects the UUT based on its ATL Address value. In this mode, only a single UUT can be selected, as all ATL Addresses are uniquely assigned to one PTB Controller. The PTB Controller selected in this mode can be enabled to drive its TDO out onto the PTB.

UUT Type Mode—This addresses UUTs based on their UUT Type, etc., as given by the UUT ID. UUT Type Mode allows a broadcast to all UUTs of the same type, revision, and/or manufacturer. In this mode, the PTB Controller is not enabled to drive its TDO on the PTB (i.e., its TDO is tri-stated).

Group Address Mode—This is a programmable addressing mode, where the test controller assigns a Group Address to each PTB Controller. Multiple PTB Controllers can be programmed with the same Group Address. As a result, using the Group Address Mode, the test controller can communicate with two or more UUTs as a group. This makes it possible to broadcast to all UUTs or to a select group of UUTs based on certain characteristics of the UUT, for example, its hardware version or what components/functions it may include. In this mode, the PTB Controller is not enabled to drive its TDO on the PTB (i.e., its TDO is tri-stated).

Alias Address Mode—This is a programmable addressing mode similar to the Group Address Mode. However, Alias Mode also allows unique addressing of a single PTB Controller. In this case, i.e., when a unique alias is assigned to a single UUT, the PTB Controller can be enabled to drive its TDO on the PTB.

Accordingly, the ATL Address Mode enables selection of a single UUT, allowing the UUT's TDO to be enabled to drive onto the PTB and the scan-out data subsequently received by the test controller. This mode can be used for testing or configuration of an individual UUT and for providing TDI data exclusively to the selected UUT, while all other UUTs are controlled to ignore the data. Thus, the ATL Address Mode can be used for debug, diagnosis, and repair, where it is necessary to send data to only one UUT or examine the actual TDO output data from the UUT with the test controller. The Type and Group Modes allow broadcasting to multiple boards and can be used for parallel configuration or testing with the PTA 500. In addition, the Alias Mode allows assigning a unique Alias Address, in which case the PTB Controller can be enabled to drive the TDO of the PTB. Assigning a unique Alias Address allows for a set of vectors for programmably configuring or testing a UUT to be independent of the ATL Address. This feature of the ATL 602 facilitates reuse of test vectors in the multi-drop test bus implementation of the PTA 500.

PTB Auto Start

As shown in FIG. 6, the ATL 602 interfaces to the PTB Auto Start circuit 608, which is configured to signal back to the test controller 502 (see FIG. 5), on the START signal of the PTB 504, that all of the UUTs 506.1–506.$n$ to be tested are present and that the test controller 502 can initiate the testing sequence. This automatic start capability enables the PTA 500 to automatically initiate testing in a production environment without operator intervention.

In the illustrated embodiment, the PTB Auto Start circuit 608 receives a UUT_PRESENT signal from the UUT. The UUT_PRESENT signal is input to the PTB Auto Start circuit 608 and is asserted when a UUT is connected to the PTB Controller 508. The assertion of UUT_PRESENT signals the PTB Auto Start circuit 608 that this UUT is connected to the UUT bus of the ATL 602 and is ready to be accessed. Once all of the UUTs 506.1–506.$n$ to be tested are connected to their associated PTB Controllers 508.1–508.$n$, the START signal is asserted on the PTB 504 and received by the test controller 502.

The ATL 602 interfaces to the PTB Auto Start circuit 608 so as to enable or disable the auto start capability, depending on whether or not the UUT for this PTB Controller 508 is expected to be present. When all of the UUTs 506.1–506.$n$ (see FIG. 5) are not populated in the PTA system, a user (e.g., a human operator or a program running on the test controller 502) may indicate which UUTs are not present via the test controller 502. The ATL 602 then knows to disable any error checking and the PTB Auto Start circuit 608 for this particular UUT. If a given PTB Auto Start circuit 608 has been disabled and the user connects a UUT, then the PTB Auto Start circuit 608 senses this condition and sets a warning status bit that can be read via the interface of the ATL 602.

Data Mask and Compare

As shown in FIG. 6, the Mask and Compare circuit 604 is connected to the PTB 504 and interfaces to the ATL 602. The Mask and Compare circuit 604 receives the EDI and MDI signals from the PTB 504 and the Actual Data In (ADI) signal from the ATL 602, and uses them to check and verify scan data from the UUT and/or the digital I/O circuit 606. The expected scan data is received on the EDI signal of the PTB 504 and is compared to the actual scan data from the UUT, received on the ADI signal from the ATL 602, when it is selected. When the PTB Controller 508 is not selected, the Mask and Compare circuit 604 is automatically disabled. During scan operations, the ATL 602 inputs whatever scan paths are configured through the ATL 602 on ADI, for example, IR scan data, TDI_UUT data, and/or the scan-out data from the digital I/O circuit 606. EDI and ADI are compared bit-by-bit as they are serially shifted into the Mask and Compare circuit 604. The PTB controller 508 may also output this TDO data onto the PTB 504, if uniquely selected. The result of each bit of comparison is either a pass or fail, depending on whether the expected and actual data bits "compare" or "miscompare", respectively.

When a bit in the expected scan data provided on EDI is specified to be an X, it can be masked using the data on the MDI line of the PTB 504. Each scan bit of EDI has a corresponding bit in the scan mask data of MDI, which is asserted to ignore the value of the corresponding ADI scan bit. Accordingly, bits that are masked in the EDI scan data pass the bit comparison with the corresponding ADI data, regardless of the ADI value. Thus, the check of any ADI scan data bits by the Mask and Compare circuit 602, where MDI is asserted, cannot cause a test failure.

As mentioned above, the Mask and Compare circuit 604 interfaces to the ATL 602. This interface enables the test controller 502 to control the functions in the Mask and Compare circuit 604. In the illustrated embodiment, the Mask and Compare circuit 604 registers a pass/fail status that can be interrogated by the test controller 502 via an ATL TAP instruction. This enables the PTA 500 to perform test or verification on a number of UUTs in parallel and receive a pass/fail status back from each of the associated PTB Controllers. Accordingly, the test controller 502 can run a test in parallel on many UUTs and then check each PTB Controller to see if there is a failure for the associated UUT. Failing UUTs may then be accessed individually, using the normal TDI-TDO access of the PTB 504, if any diagnosis and repair of the UUT is necessary.

The Mask and Compare circuit 604 may have further functional capabilities, which are controlled through the interface to the ATL 602. In the illustrated embodiment, there is an enable/disable function for the Mask and Compare circuit 604. This allows compare operations and latching of the pass/fail status in the PTB Controller 508 to be manually disabled. Further, the Mask and Compare circuit 604 may take certain actions upon detection of a miscompare. In the illustrated embodiment, a miscompare causes the UUT to be forced into its Test-Logic-Reset state when a failure is detected. This is done automatically by the PTB Controller 508 by forcing the TMS_UUT into TLR_Mode. Further, the PTB Controller 508 allows the current scan operation to complete before forcing the UUT into its Test-Logic-Reset state. Accordingly, the TLR_Mode is established subsequent to the Update-DR or Update-IR of the current scan operation. This prevents potential damage to the UUT due to a manufacturing defect, as detected by the miscompare of the expected scan data.

As described above, the Mask and Compare circuit 604 allows data comparisons to be performed for all UUTs of the same type in parallel. The PTB's EDI and MDI signals and their connection to the Mask and Compare circuit 604 make this parallel test and verification capability possible. These features enable checking of each UUT's TDO data to be done simultaneously, i.e., in parallel, by each of the PTB Controllers 508.1–508.$n$ rather than by the test controller 502, thereby optimizing the test time of the UUTs 506.1–506.$n$. As a result, the time to test n UUTs of the same type using the PTA 500 is equal to the time it takes to test a single UUT by itself.

Digital I/O

As shown in FIG. 6, the PTB Controller 508 includes the Digital I/O (DIO) circuit 606, which interfaces to the ATL 602 and the UUT. The DIO circuit 606 provides the UUT connected to the PTB Controller 508 with a number of parallel (i.e., "broadside") inputs and outputs DIO_UUT[n:0]. The DIO_OUT lines can be controlled over the PTB 504 by the test controller 502 or directly by the ATL 602, and can be used in addition to the scan interface to the UUT to facilitate testing, debugging, or configuration of the UUT. In the illustrated embodiment, the DIO_UUT lines are implemented as programmable input/output (i.e., bi-directional) signals. Alternatively, each of the DIO_UUT lines may be implemented as a fixed input or output signal.

In the illustrated embodiment, the DIO circuit 606 has a serial interface to the ATL 602 through which the input/output data and direction control of the DIO_UUT lines can be accessed. Further, the DIO circuit 606 can be accessed via the serial interface to the ATL 602 either separately, for example, through the normal TDI-TDO of the PTB 504, or chained in series with the scan path of the UUT. This enables the parallel I/O lines of the DIO circuit 606 to be accessed by the test controller 502 over the PTB 504 along with the scan data for the UUT. As a result, any parallel data from the UUT input to the DIO_UUT lines can be serialized on the TDI UUT input. It can then be sent on the ADI output of the ATL 602 to the Mask and Compare circuit 604 and checked using the EDI and MDI data from the test controller 502.

Programmable I/O Voltage

As shown in FIG. 6, the PTB Controller 508 further includes the Programmable I/O Voltage circuit 610, which also interfaces to the ATL 602. In the illustrated embodiment, the Programmable I/O Voltage circuit 610 is used to set the voltage level for the UUT interface to assure electrical compatibility with the UUT and proper operation with the ATL interface. Through the interface with the ATL 602, the threshold for the logic 1 or "high" voltage level can be set and subsequently controlled by the Programmable I/O Voltage circuit 610. For example, the voltage may be selected as 5 volts, 3.3 volts, etc., depending on the specific technology requirements of the UUT interface. In addition, the voltage from the Programmable I/O Voltage circuit 610 may be turned off or set so that an externally supplied (e.g., by the user) voltage level can be set to power the interface to the UUT.

ATL Instructions

TAP Controller instructions for the ATL 602 (see FIG. 6), as employed in the PTA 500 (see FIG. 5), are described below. The ATL TAP Controller instructions are issued by the test controller 502 or a master controller on the PTB 504. The test controller 502 uses these ATL TAP instructions in communicating with the PTB Controllers 508.1–508.*n* (see FIG. 5) to access the features of the PTA 500. As multiple ATLs are connected in parallel on the PTB 504 and operate in lock step, all of the ATLs implement the same TAP Controller instructions and opcodes. For all of the instructions described below, the ATL 602 is not enabled to drive its TDO out onto the PTB 504 unless it was previously selected with its ATL Address or a unique Alias Address.

It is noted that some of the instructions described below are optional, depending on the particular configuration of the parallel test architecture. For example, when the ATL 602 is used in a standalone application or other application that does not require parallel test functions, the COMPARE_STATUS and AUTO_START instructions may not be implemented as they control functions and data registers in the PTB Controller 508 that are not needed for standalone ATL operation.

BYPASS—This instruction is the standard IEEE 1149.1 BYPASS instruction. It selects a single bit Bypass register in the Addressable TAP Linker (ATL) 602 between TDI and TDO. If the IDCODE instruction described below is not implemented, the BYPASS instruction is loaded into the ATL's Instruction Register (IR) when it is reset over the Parallel Test Bus (PTB) 504.

IDCODE—The IDCODE instruction can be used to select the Device_ID register, which provides a standard 32-bit IEEE 1149.1 identification code. The Device_ID register in the ATL 602 is selected between TDI and TDO. When implemented, the IDCODE instruction is loaded into the ATL's IR when it is reset.

SAMPLE/PRELOAD—This instruction can be used to sample the I/O pins of the PTB Controller 508 or pre-load values into the PTB Controller's boundary scan cells. It is noted that the PTB Controller 508 may have dedicated test pins that are not fully compliant with the IEEE 1149.1 Boundary Scan Architecture. Thus, this instruction may not access every pin of the PTB Controller 508.

EXTEST—This instruction is similar to the standard IEEE 1149.1 EXTEST instruction. As in the SAMPLE/PRELOAD instruction, the dedicated test pins of the PTB Controller 508 may not be fully compliant with the IEEE 1149.1 Boundary Scan Architecture, and therefore the EXTEST instruction may not control every pin of the PTB Controller 508.

LOAD_ATL_ADDR—The LOAD_ATL_ADDR instruction is implemented when the ATL 602 provides for loading an ATL Address. In the illustrated embodiment, the ATL_ADDR inputs are direct parallel inputs to the PTB Controller 508 and the LOAD_ATL_ADDR instruction is therefore not implemented.

When implemented, the LOAD_ATL_ADDR instruction causes the ATL Address from the ATL's ATL_ADDR inputs to be captured into the ATL_Address register. Depending on the implementation, it is either serially loaded (e.g., in the ATL TAP Controller's Run-Test/Idle state) or captured directly from the ATL_ADDR inputs. In either case, the ATL_Address register is the same size, i.e., n+1 bits, as would be required by an implementation with parallel ATL_ADDR inputs. The test controller 502 can examine the ATL Address captured in the ATL_Address register if the ATL 602 is selected.

SELECT_ATL—The SELECT_ATL instruction is used to select a single PTB Controller 508 based on its ATL Address. The SELECT_ATL instruction serially loads an ATL Address from the test controller 502 into the Select_ATL register, and compares it with the ATL_ADDR inputs to the ATL 602 or with the ATL_Address register (i.e., as was loaded by the LOAD_ATL_ADDR instruction). The Select_ATL register is configured to be the same size, i.e., n+1 bits, as the ATL_ADDR inputs (or the ATL_Address register). When the LOAD_ATL_ADDR instruction is not implemented, the SELECT_ATL instruction captures the ATL_ADDR inputs into the Select_ATL register (i.e., during Capture-DR prior to shifting in the ATL Address from the test controller 502).

If the Select_ATL register compares to the ATL_ADDR inputs (or the ATL_Address register), the PTB Controller 508 becomes uniquely selected and its TDO is enabled to drive onto the PTB 504. Once selected, the test controller 502 may issue other instructions and communicate with the attached UUT. The PTB Controller 508 remains selected until an UNSELECT_ALL instruction (as described below) is issued, another instruction that does not select this PTB Controller 508 is issued (e.g., a SELECT_ALIAS instruction that loads an ATL Address for another PTB Controller), or the ATL is reset. Following a SELECT_ATL instruction, the test controller 502 may issue another instruction such as the BYPASS or IDCODE instruction to verify that a PTB Controller was selected and is therefore driving data onto the TDO of the PTB.

LOAD_UUT_ID—The LOAD_UUT_ID instruction is implemented when the ATL 602 provides for loading a UUT ID code. In the illustrated embodiment, loading of the UUT ID is not provided and the UUT ID is input directly from the UUT_ID lines of the PTB Controller 508.

When implemented, the LOAD_UUT_ID instruction causes the UUD ID from the ATL's UUT_ID[n:0] inputs to be captured into the UUT_ID register. Depending on the implementation, it is either serially loaded (e.g., in the ATL TAP Controller's Run-Test/Idle state) or loaded directly from the UUT_ID[n:0] inputs. The test controller 502 can examine the UUT ID captured in the UUT_ID register if the ATL 602 is selected.

SELECT_TYPE—The SELECT_TYPE instruction serially loads a UUT Type from the test controller 502 into the Select_Type register and compares it with the UUT Type bits of the UUT ID. Depending on the implementation, the UUT Type is a bit field in the UUT_ID register, or directly input on the UUI_ID[n:0] lines of the ATL 602. The UUT Type is configured to be the same number of bits as the UUT Type field in the UUT_ID register or from the UUT_ID[n:0] inputs. When the LOAD_UUT_ID instruction is not implemented, the SELECT_TYPE instruction captures the UUT_ID into the Select_Type register (i.e., during Capture-DR before shifting in the UUT Type from the test controller 502).

In the presently disclosed embodiment of the ATL 602, the Select_Type register is configured to compare both the UUT Type and UUT Manufacturer codes. In this case, the UUT Type is provided by direct parallel inputs to the ATL 602 and the UUT Manufacturer is provided as an internal code within the ATL 602. This provides a way in which the UUT Type can be specified by the user and yet be independent of the UUT Types of other vendors, as different vendors would be assigned unique UUT Manufacturer codes. Thus, even if two users assign the same UUT Type to a UUT, they can still be differentiated when necessary by their unique Manufacturers codes.

If the Select_Type register compares to the corresponding UUT Type and UUT Manufacturer, the PTB Controller 508 becomes selected. Because multiple PTB Controllers may be selected by this instruction (e.g., same type and same vendor), its TDO is not enabled to drive onto the PTB 504. Thus, the test controller 502 communicates in parallel with all UUTs of the type specified by the Select_Type register, but without the PTB Controller 508 enabled to drive its TDO on the PTB 504.

PROGRAM_GROUP—The PROGRAM_GROUP instruction serially loads the Group_Address register with a programmable Group Address, as assigned by the test controller 502. If the PTB Controller 508 was previously selected by an ATL Address or a unique Alias Address, it can be enabled to drive its TDO on the PTB 504 and the current Group_Address register contents, as captured in the Capture-DR state, can be scanned out and examined by the test controller 502. The Group_Address register of the ATL 602 is updated if the PTB Controller 508 was previously selected, i.e., by an ATL Address, Alias Address, UUT Type, or Group Address (see the SELECT_GROUP instruction described below) match. Where the PTB Controller 508 has not been selected, the updating of the Group_Address register is disabled. The Group_Address register is assigned the all 0's address whenever the ATL 602 is reset.

SELECT_GROUP—Using the SELECT_GROUP instruction, a Group Address can be serially loaded from the test controller 502 into the Select_Group register and compared with the programmable Group_Address register. The Select_Group register is configured to be the same number of bits as the Group_Address register. If the Group Address in the Select_Group register matches that of the Group_Address register, the PTB Controller 508 becomes selected. However, since multiple PTB Controllers 508 may be selected by this instruction, its TDO is not enabled to drive onto the PTB 504. Thus, the test controller 502 communicates in parallel with all UUTs that are assigned the same Group Address, but without the PTB Controller 508 enabled to drive its TDO on the PTB 504.

PROGRAM_ALIAS—The PROGRAM_ALIAS instruction is used to assign an Alias Address to the PTB Controller 508. This instruction selects the Alias_Address register and serially loads it with a programmable Alias Address, as assigned by the test controller 502. A common Alias Address can be assigned to all PTB Controllers or a specific group of PTB Controllers, or a unique Alias Address can be assigned to a single PTB Controller. By assigning a common alias to a group of PTB Controllers, the test controller 502 can address and select them as a group and can be enabled to broadcast to this group in parallel. This is just as in the PROGRAM_GROUP and SELECT_GROUP instructions. By assigning a unique Alias Address to a single PTB Controller, vectors for programmably configuring or testing a UUT can be made independent of the physical ATL Address, as specified on or loaded from the ATL_ADDR inputs to the ATL 602.

The Alias_Address register is updated only if the PTB Controller 508 was previously selected, i.e., by an ATL Address, UUT Type, Group Address, or other Alias Address (see the SELECT_ALIAS instruction described below). If the PTB Controller 508 has not been selected, the updating of the Alias_Address register is disabled. The Alias_Address register is configured to be one bit longer than the Select_ATL register. This additional bit, called the Unique_Alias bit, is used to indicate that the Alias_Address has been programmed to a unique Alias Address on the PTB 504. In the illustrated embodiment, the Unique_Alias bit is implemented as the Most Significant Bit (MSB) of the Alias_Address register. When the Unique_Alias bit is set to logic 1, the selected PTB Controller can be enabled to drive its TDO on the PTB 504. When assigning a unique Alias Address, the test controller 502 assures that any such Alias Address is unique to a respective PTB Controller. The Alias_Address register is loaded with an all 0's address when the ATL is reset. Consequently, the Unique_Alias bit in each PTB Controller is cleared, and thus the initial Alias Address is not unique and the PTB Controller is not enabled to drive TDO.

SELECT_ALIAS—The SELECT_ALIAS instruction serially loads an Alias Address from the test controller 502 into the Select_Alias register and compares it with the programmable Alias_Address register. The Select Alias register is configured to be the same number of bits as the Select ATL register. If the Alias Address in the Select_Alias register matches that of the programmable Alias_Address register, the PTB Controller 508 becomes selected. In comparing the Select_Alias register against the Alias_Address register, the Unique_Alias bit in the Alias_Address register is ignored. Consequently, if the Select_Alias register and the Alias_Address register match, the Unique_Alias bit determines if the PTB Controller 508 enables its TDO to drive onto the PTB 504. Since multiple PTB Controllers may be selected by this instruction, a particular PTB Controller is not enabled to drive TDO on the PTB 504 unless the test controller 502 has set the Unique_Alias bit when programming the Alias_Address register. Thus, when multiple UUTs are selected, the test controller 502 communicates in parallel with all UUTs, i.e., those programmed to the same Alias Address, but without the PTB Controller 508 enabled to drive its TDO on the PTB 504.

UNSELECT_ALL—Loading the UNSELECT_ALL instruction into the IR of the ATL 602 causes all PTB Controllers to enter a state where they are not selected. This "unselects" any selections made by the current addressing mode, i.e., ATL Address Mode, UUT Type Mode, Group Mode, or Alias Address Mode. Following the UNSELCT_ALL instruction, none of the PTB Controllers can be enabled to drive the TDO of the PTB 504. The UNSELECT_ALL instruction selects the Bypass register, or the Device_ID register if the IDCODE instruction is implemented.

DIO_ACCESS—The DIO ACCESS instruction is used to access the data register that controls the DIO_UUT[n:0] lines. It selects the DIO_UUT register in the Digital I/O circuit 606 between TDI and TDO of the PTB 504. For this instruction, the ATL 602 cannot enable its TDO to drive out onto the PTB 504 unless it was previously selected with its ATL Address or a unique Alias Address. Further, the DIO_UUT register captures, shifts, and updates data if the PTB Controller 508 was previously selected, i.e., by an ATL Address, UUT Type, Group Address or Alias Address match. Accordingly, if the PTB Controller 508 was uniquely selected, it can be enabled to drive its TDO on the PTB 504 and the current DIO_UUT register contents can be scanned out and examined by the test controller 502. If the PTB Controller 508 has not been selected, shift, update, and capture operations of the DIO_UUT register are disabled.

The data scanned out from the DIO_UUT register can also be selectively routed to the Mask and Compare circuit 604, SO that the DIO data can be masked with the MDI and compared against the EDI signals of the PTB. This makes it possible for the Digital I/O received from the UUT to be checked in parallel, in each PTB Controller, during testing of the UUTs. The DIO_UUT register is reset such that all UUT_DIO[n:0] lines are inputs whenever the ATL 602 is reset.

TMS_CONTROL—This instruction is used to coordinate the operation of the UUT TAP Controller with the TAP Controller of the ATL 602. It enables the test controller 502 to communicate with just the ATL 602 while the connected UUT TAP Controller is held in a stable state, or to communicate with the UUT via the ATL 602 while the two TAP Controllers operate in lock step.

The TMS_CONTROL instruction selects the TMS_Control register, which is then loaded with a TMS control code from the test controller 502. Depending on the TMS control code that was loaded into the TMS_Control register, the TMS_UUT output of the ATL 602 is controlled in one of four modes, as described below.

TLR_Mode—TMS_UUT is forced to logic 1 on the falling edge of TCK during Update-DR of the TMS_Control register. This causes the TAP Controller of the UUT to move to Test-Logic-Reset (following at least 5 TCK clocks) and remain there until the UUT TMS is changed back to TMS_Mode. The TLR_Mode may be entered from any of the other TMS modes.

RTI_Mode—TMS_UUT is forced to logic 0 on the falling edge of TCK during Update-DR of the TMS_Control register. The UUT TAP controller moves to Run-Test/Idle (on the next rising edge of TCK) and remains there until the UUT TMS is changed back to TMS_Mode or TLR_Mode. The RTI_Mode may be entered from the TLR_Mode or the TMS_Mode, or while in the RTI-Pause_Mode and when the UUT TAP is not waiting in Pause-DR or Pause-IR.

RTI-Pause_Mode—The RTI-Pause_Mode controls the TMS_UUT such that the UUT TAP controller alternates between remaining in Run-Test/Idle, and either Pause-DR or Pause-IR, when the ATL 602 is alternately selected/unselected. The RTI-Pause_Mode may be entered from the TLR_Mode, the TMS_Mode or while in the RTI-Pause_Mode and when the UUT TAP is not waiting in Pause-DR or Pause-IR.

TMS_Mode—The TMS_Mode causes the TMS_UUT to resynchronize with the PTB's TMS, depending on the previous mode, and thereafter follows the value of the PTB's TMS.

The TMS_Control register captures, shifts, and updates data if the PTB Controller 508 was previously selected, i.e., by an ATL Address, UUT Type, Group Address or Alias Address match. Accordingly, if the PTB Controller 508 has not been selected, the TMS_UUT output remains at its last controlled value per the code in the TMS_Control register. Similarly, the TMS_UUT does not change state in the RTI-Pause_Mode to synchronize out of Run-Test/Idle or Pause-DR/Pause-IR, unless the ATL 602 has been selected.

Following a reset of the PTB Controller 508 on the PTB 504, the TMS_Control register is reset such that it controls the TMS_UUT signal with the TLR_Mode. Consequently, the UUT TAP Controller remains in Test-Logic-Reset until the TMS control code is subsequently changed by a TMS_CONTROL instruction. It is also possible to reset the UUT TAP Controller, or a group of UUT TAP Controllers, independently of the global TRSTN on the PTB. For example, by using the GROUP_SELECT instruction, a specified group of UUTs can be reset by the test controller 502 using a TMS reset, while the remaining (i.e., unselected) UUT TAP Controllers wait in Run-Test/Idle. By setting the TMS_Control registers in the selected group to TLR_Mode, a TMS reset can be performed on the group of UUTs while the ATL 602 moves to Run-Test/Idle and clocks TCK. Transitions between the TMS control modes are described below.

The RTI-Pause_Mode allows efficient control of two or more UUTs such that they can be scanned separately but execute their Update-DR or Update-IR states concurrently. For example, this mode may be used to perform board-to-board interconnect testing in a system. With the TMS control mode set to RTI-Pause_Mode and the UUT TAP Controllers in Run-Test/Idle, a selected ATL becomes synchronized with the UUT TAP Controllers as the ATL TAP passes through Run-Test/Idle. Subsequently, the TMS_UUT follows the PTB TMS until the ATL 602 enters either the Pause-DR or Pause-IR state. Entering one of the Pause-DR/IR states causes TMS UUT to be controlled to logic 0, which forces the UUT TAP Controller to remain in the respective Pause-DR/IR state. When the ATL 602 is selected and next enters the corresponding Pause-DR or Pause-IR state, the ATL 602 and UUT TAP Controllers become synchronized and TMS_UUT again follows that of the PTB 504. Subsequently, when the ATL 602 next enters Run-Test/Idle, it causes TMS_UUT to be controlled to logic 0, forcing the UUT TAP to once again remain in its Run-Test/Idle state. This sequence of synchronizing/remaining in Run-Test/Idle or Pause-DR/IR continues as long as the RTI-Pause_Mode is in effect.

When the TMS_Control register is subsequently updated with the control code for TMS_Mode, the TMS_UUT output does not change from a previous stable state, i.e., Test-Logic-Reset, Run-Test/Idle, Pause-DR, or Pause-IR, until the ATL TAP Controller enters Run-Test/Idle or the respective Pause-DR or Pause-IR state. These states are the synchronizing or trigger states. Following entry into the appropriate synchronizing state, the TMS_UUT signal is controlled accordingly to transition the UUT TAP from its previous state, as determined by the previous TMS mode, to become synchronized with the ATL TAP Controller trigger state. Once both TAP Controllers have synchronized states, the TMS_UUT follows the TMS of the PTB 504 and the TAP controllers in the ATL 602 and the UUTs operate in lock step, as long as the PTB Controller 508 remains selected. Providing a trigger state for synchronization allows the test controller 502 to continue to communicate with other PTB Controllers and then transition the UUTs back to TMS_Mode following the communication to the PTB Controllers.

When TMS_UUT is controlled in TMS_Mode (i.e., to follow the PTB TMS), instructions and data are scanned into both the ATL 602 and the UUT, as the scan paths between them are chained together. Accordingly, the TDO_UUT output is enabled to drive out data to the UUT, so that when the ATL TAP controller is in Shift-DR or Shift-IR, scan data is driven out of the TDO_UUT to the UUT's TDI. Depending on the instructions loaded into the ATL IR and the UUT IR, any data register in the ATL 602 can be chained together with any data register in the UUT. So, for example, the DIO_UUT register of the ATL 602 can be chained to the internal scan register of the UUT. When the TMS_UUT output is controlled to any other TMS mode, the TDO_UUT output is not enabled to drive out, i.e., it remains in the high impedance state.

Before a PTB Controller 508 becomes unselected, the TMS_UUT output is controlled such that the UUT TAP Controller remains in Run-Test/Idle (e.g., by loading the TMS_Control register with RTI_Mode). This is to assure that when unselected, the UUTs are not left in a TMS control mode such that they continue to follow the TMS of the PTB. In the presently disclosed embodiment of the PTA 500, the PTB Controller 508 handles this automatically. While the PTB Controller 508 is in TMS_Mode, and when it subsequently becomes unselected, the TMS_UUT output is provisionally controlled to enter RTI_Mode when the ATL TAP Controller enters the Run-Test/Idle trigger state. When the PTB Controller 508 subsequently becomes selected, the TMS_UUT begins to follow the TMS of the PTB 504 after the ATL TAP Controller passes through Run-Test/Idle. Thus, while in TMS_Mode, the PTB Controller 508 assures that the UUT does not continue to follow the TMS of the ATL TAP Controller when it becomes unselected.

COMPARE_STATUS—The COMPARE_STATUS instruction selects the Compare_Status register in the Mask and Compare circuit 604. The test controller 502 can use this instruction to read or clear the pass/fail status of each PTB Controller 508.1–508.n and control the various functions of the Mask and Compare circuit 604.

In the presently disclosed embodiment of the PTA 500, the Compare_Status register is a 3-bit data register. One bit functions as a Pass/Fail_Status bit that is set when a miscompare is detected by the Mask and Compare circuit 604. The test controller 502 may then read the Compare_Status register to check if miscompare occurred, i.e., the Pass/Fail_Status bit is set. It can also clear the Pass/Fail_Status bit, i.e., following miscompare, to start a new test with the status cleared. A second bit in the Compare_Status register, Compare_Enable, is used to enable/disable the compare function, and a third bit, TLR_Enable, enables/disables forcing the UUT into TLR_Mode upon failure.

The Compare_Status register captures, shifts, and updates data if the PTB Controller 508 was previously selected, i.e., by an ATL Address, UUT Type, Group Address or Alias Address match. When the PTB Controller 508 is reset, the Compare_Status register is cleared such that the Pass/Fail_Status bit is reset to a passing status and the Compare_Enable and TLR_Enable functions are enabled.

AUTO_START—The AUTO_START instruction selects the Auto_Start register in the PTB Auto Start circuit 608. The test controller 502 uses this instruction to interrogate the UUT_PRESENT input to the PTB Auto Start circuit 608 and to enable or disable the START output to the PTB 504. In the presently disclosed embodiment of the PTA 500, the Auto_Start register is a 2-bit DR—a first bit captures the state of the UUT_PRESENT line and a second bit controls whether the START line is enabled on the PTB 504. The Auto_Start register captures, shifts, and updates data if the PTB Controller 508 was previously selected, i.e., by an ATL Address, UUT Type, Group Address, or Alias Address match. When the PTB Controller 508 is reset, the UUT Present bit is cleared and START is disabled.

PROGRAM_IOV—The PROGRAM_IOV instruction selects the IO_Voltage register in the Programmable I/O Voltage circuit 610 and is used to program the UUT interface voltage. In the presently disclosed embodiment, the IO_Voltage register is a 2-bit DR that encodes four programmable voltage levels, e.g., 5 volts, 3.3 volts, USER_SUPPLIED, and "off". The IO_Voltage register captures, shifts, and updates data if the PTB Controller 508 was previously selected, i.e., by an ATL Address, UUT Type, Group Address, or Alias Address match. When the PTB Controller 508 is reset, the IO_Voltage register is set to off.

PTB Bridging

The Parallel Test Architecture (PTA) implementations that require highly parallel capabilities may be limited by the number of PTB Controllers that can be supported on the parallel test bus (due to electrical loading, transmission distances, or other design limitations). Accordingly, the presently disclosed PTA provides for bridging between two Parallel Test Buses (PTBs). This enables the PTA to effectively test any suitable number of UUTs in parallel. This type of capability is needed for wafer probe test applications and for high-throughput board test stations.

Figure 8:
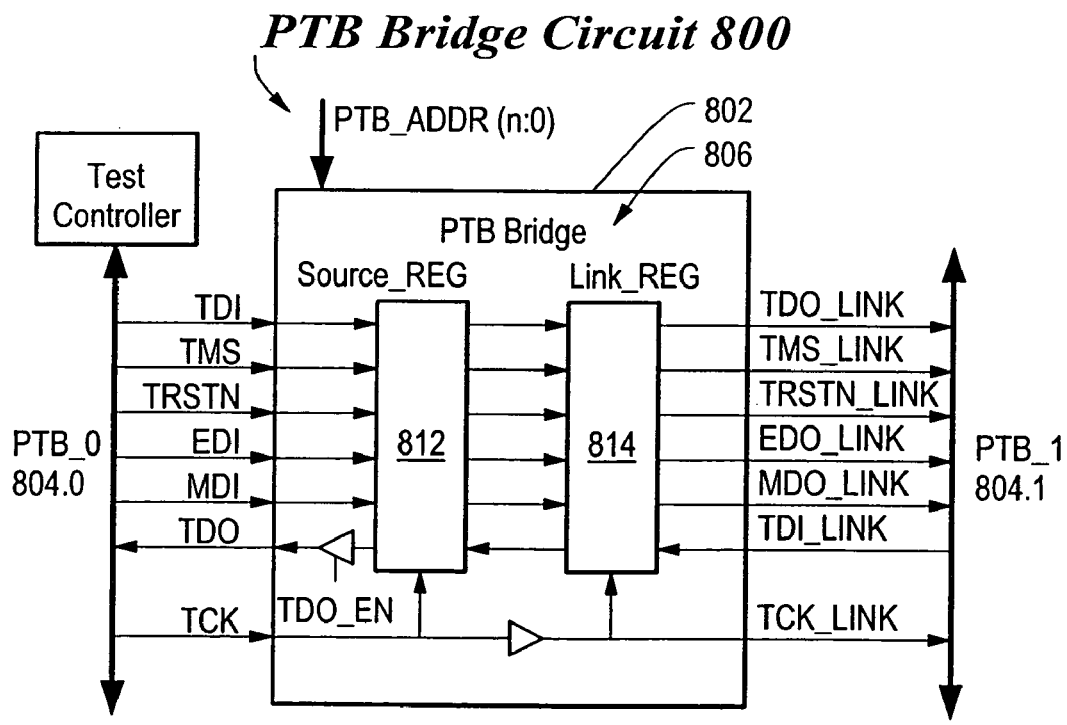
FIG. 8 is a block diagram depicting a parallel test bus bridge according to the present invention.

FIG. 8 depicts an illustrative embodiment of a PTB Bridge circuit 800. The PTB Bridge 800 is similar to the PTB Controller 508 (see FIG. 6) in that it includes an ATL (not shown) and an address on the Parallel Test Bus (PTB), labeled as PTB_ADDR[n:0] in FIG. 8. This PTB Address may be independent of the ATL Addresses and is large enough to support the total number of PTB Bridges in the given PTA system. FIG. 8 shows the PTB Bridge 802 connected between two PTBs, PTB_0 804.0 and PTB_1 804.1, along with the circuit 806 for the PTB bridging function. A PTB Bridge connects one PTB as the source PTB to another PTB as the bridged, or linked, PTB. In FIG. 8, the PTB_1 804.1 is bridged to the source PTB_0 804.0.

Figure 10:
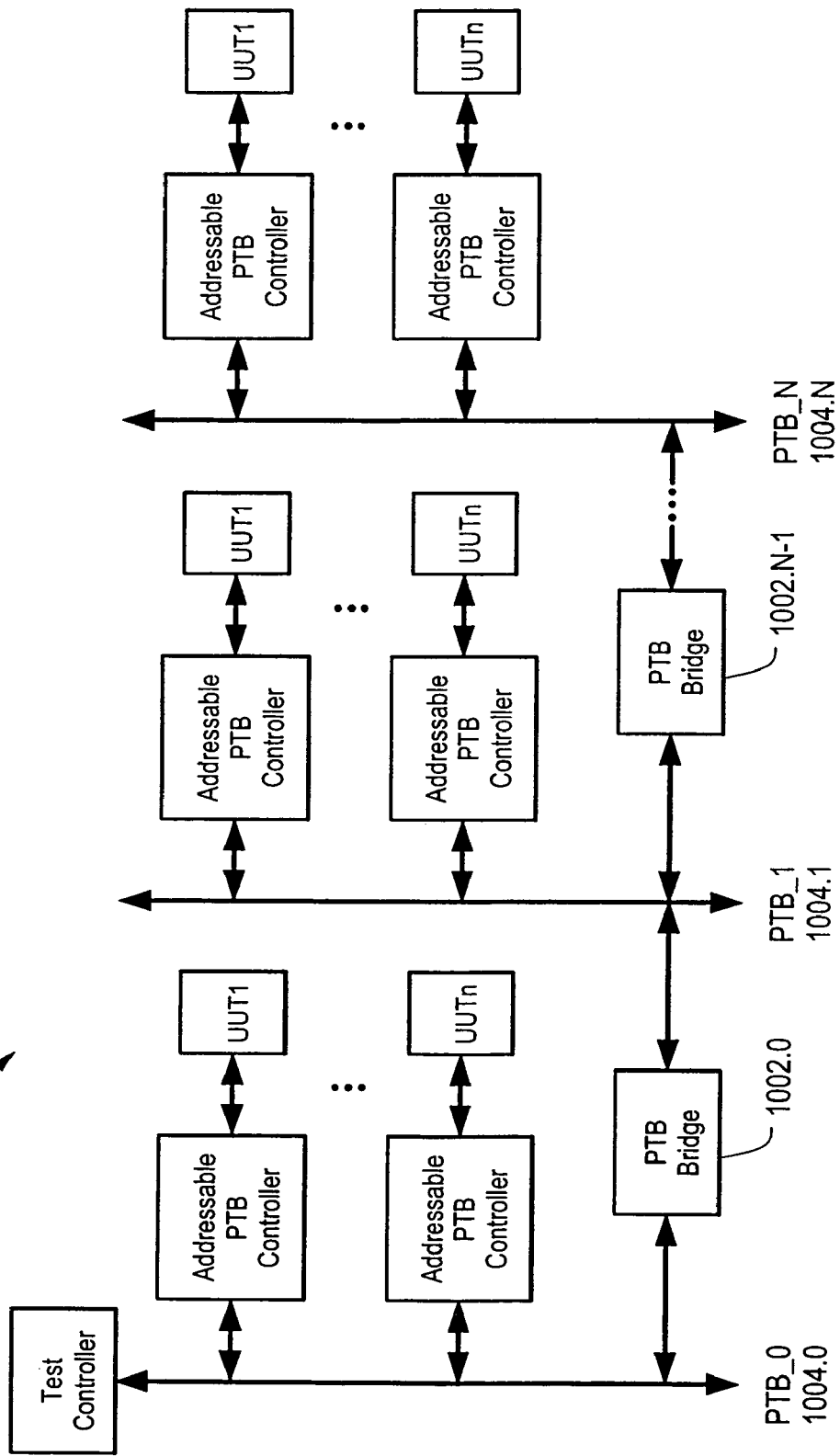
FIG. 10 is a block diagram depicting the parallel test architecture of FIG. 5 including a bridged configuration of the parallel test bus.
Figure 11:
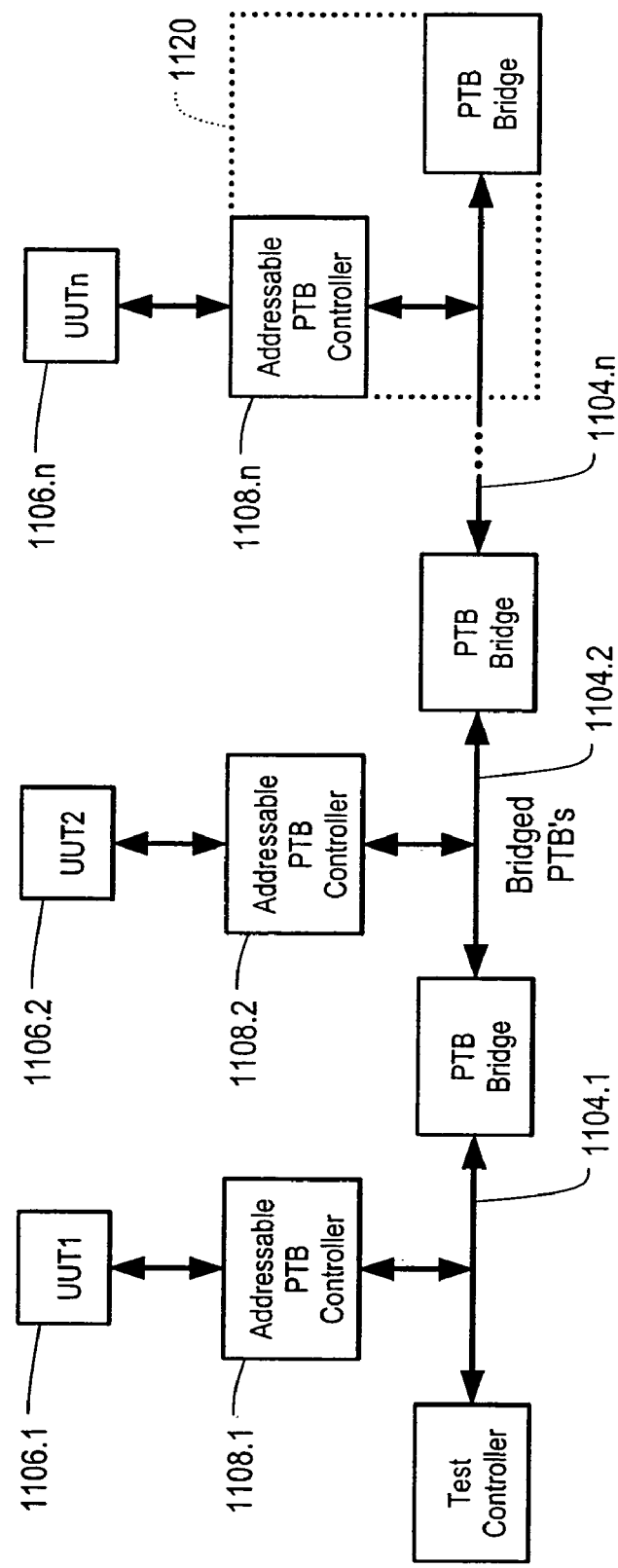
FIG. 11 is a block diagram depicting the parallel test architecture of FIG. 5 including an alternative bridged configuration of the parallel test bus.

FIGS. 10–11 depict illustrative embodiments of Bridged PTB configurations 1000 and 1100, respectively, of the PTA. As shown in FIG. 10, N+1 PTBs are linked via N PTB Bridge circuits 1002.0–1002.N–1, i.e., PTB_0 1004.0 through PTB_N 1004.N, and each PTB 1004.0–1004.N supports up to n UUTs. This configuration 1000 can support a large number of UUTs with relatively few PTB Bridges. The bridged PTB configuration 1100 shown in FIG. 11 includes N linked PTBs 1104.1–1104.N, each connected to a respective PTB Controller 1108.1–1108.N. In this way, the PTA can be easily expanded to accommodate a large number of UUTs 1106.1–1106.N. By utilizing an addressable PTB Controller and a PTB Bridge for each UUT, the PTA system is not limited to supporting a specific number of UUTs connected by a multi-drop bus. It is noted that in both configurations 1000 and 1100, the ATL Address space supports a unique address for each PTB Controller. Thus, in FIG. 10, if N=2 and n=12, then 14 unique ATL Addresses are required. In this case, there are 2 unique PTB Addresses for the PTB Bridge circuits. In FIG. 11, if the PTB Controller and PTB Bridge are combined into a single circuit, as shown at reference numeral 1120, then it is possible to combine the ATL and PTB Addresses (i.e., requiring only 12 unique addresses for n=12), and at least some of their associated instructions may be merged. It should be appreciated that other configurations of the PTB Bridge circuit are possible.

As shown in FIG. 8, there are two registers in the PTB Bridge 802, specifically, a Source_REG 812 and a Link_REG 814. The Source_REG 812 is clocked by the TCK from the source PTB_0 804.0, and the Link_REG 814 is clock by the TCK_LINK clock, which clocks the linked PTB_1 804.1. So, the PTB Bridge 802 buffers the TCK clock of the source PTB_0 804.0 and uses it to clock the PTB signals for the PTB_1 804.1 connected on the linked side of the PTB Bridge circuit 800. Accordingly, when two PTBs are bridged, the linked PTB is one TCK cycle delayed from the source PTB. The test controller 502 takes this TCK link cycle into account when it communicates over a linked PTB and manages the PTB protocol appropriately for the bridged PTB configuration. Any number of PTB Bridges 802 can be implemented for a given PTA configuration, with a single cycle TCK delay penalty for each PTB Bridge.

Figure 9:
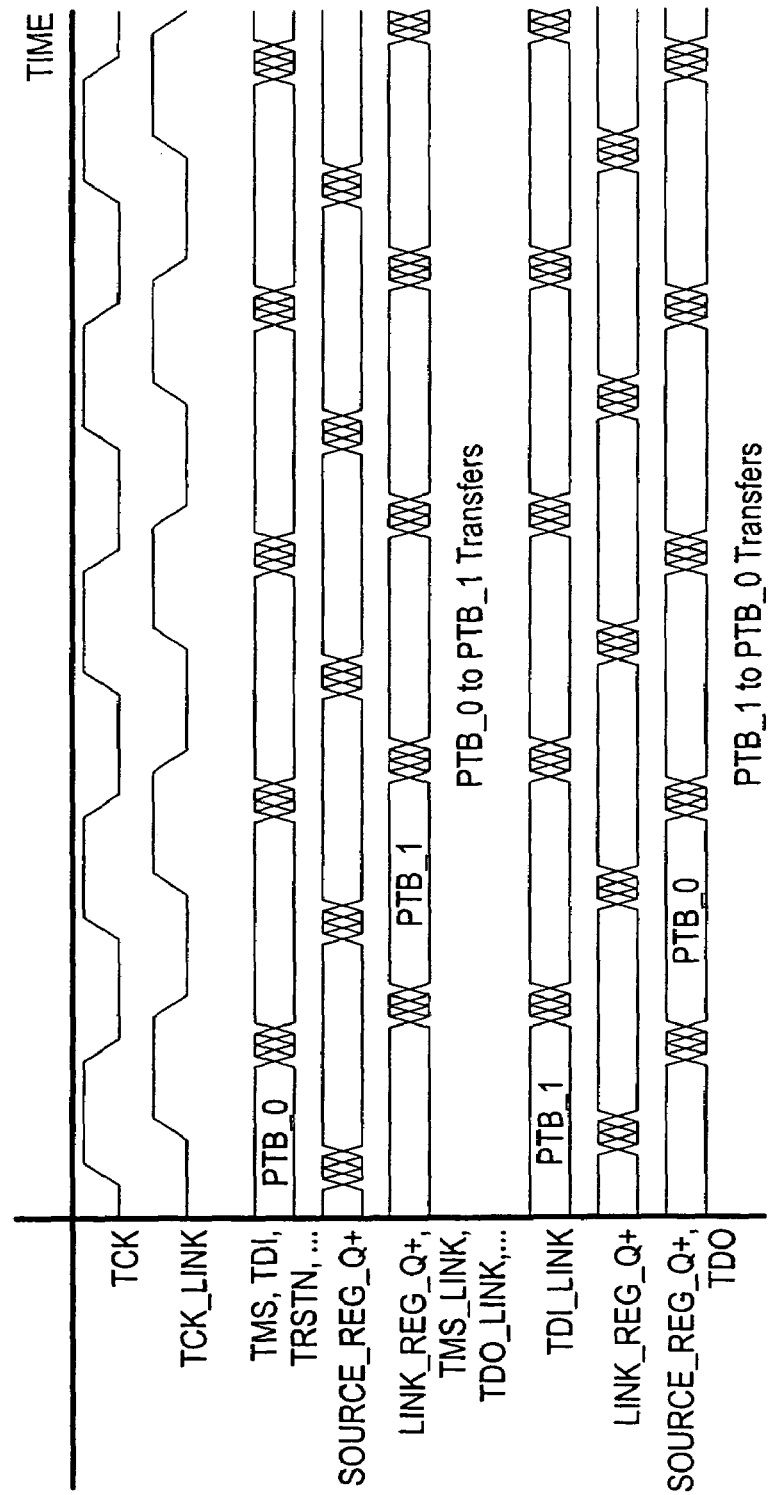
FIG. 9 is a timing diagram depicting bus-to-bus transfers using the parallel test bus bridge of FIG. 8.

FIG. 9 depicts a timing diagram 900 of PTB Bridge transfers between the two linked PTBs 804.0–804.1 (see FIG. 8). As shown in FIG. 8, the TRSTN signal of PTB_0 804.0 and the TRSTN_LINK signal of PTB_1 804.1 are registered through the Source_REG and Link_REG registers 812 and 814. This requires that during an asynchronous reset of the PTA (i.e., asserting the PTB's TRSTN), TCK clock the TRSTN signals through each of the PTB Bridges, as shown in FIG. 9. In further embodiments of the PTA, the signals on the source and link side of the PTB Bridge 802, e.g., TRSTN and TRSTN_LINK, respectively, may be buffered (i.e., not registered) through the PTB Bridge circuit 800.

When the PTB Bridge circuit 800 is reset, the BYPASS instruction (or IDCODE instruction, if implemented) is loaded. Further, the PTB Bridge 802 is unselected, i.e., it is not enabled to drive its TDO onto the source PTB_0 804.0, and the TDO of the source PTB_0 804.0 and the TDI_LINK of the linked PTB_1 804.1 are unlinked. The inputs to the PTB Bridge 802 on the source side (i.e., TDI, TMS, etc. shown in FIG. 8) remain linked to the respective outputs of the PTB Bridge 802 on the linked side (i.e., TDO_LINK, TMS_LINK, etc.) regardless of the ATL instruction loaded in the PTB Bridge 802. Thus, the TAP Controllers of the PTB Bridges operate in lock step with that of the test controller. Further, the test controller is capable of communicating with all PTB Controllers in parallel via the PTB Bridges.

As the PTB Bridge 802 (see FIG. 8) does not have a UUT connected to it, the UUT related instructions of the PTB Controller 508 (see FIG. 6) are not required. Thus, the ATL (not shown) in the PTB Bridge 802 may only respond to a subset of the instructions used by the PTB Controller's ATL 602. Accordingly, in the illustrated embodiment of the PTB Bridge 802, the ATL for the PTB Bridge 802 responds to the BYPASS, IDCODE, EXTEST, PRELOAD, and UNSELECT_ALL instructions. In addition, the PTB Bridge 802 implements the SELECT_PTB, LINK_PTB and UNLINK_ALL instructions, which are described below, and optionally the LOAD_PTB_ADDR instruction. Correspondingly, these PTB Bridge instructions are ignored by the ATL 602 of the PTB Controller 508. It is noted that both the ATL 602 in the PTB Controller 508 and the ATL in the PTB Bridge 802 have the same IR length in their TAP Controllers.

The PTB Bridge instructions LOAD_PTB_ADDR, SELECT_PTB, and LINK_PTB are described below.

LOAD_PTB_ADDR—The LOAD_PTB_ADDR instruction is implemented when the PTB Bridge 802 provides for loading a PTB Address. In the presently disclosed embodiment of the PTA, the PTB_ADDR inputs are direct parallel inputs to the PTB Bridge 802 and the LOAD_PTB_ADDR instruction is not implemented.

When implemented, the LOAD_PTB_ADDR instruction causes the PTB Address from the PTB Bridge's PTB_ADDR inputs to be captured into the PTB_Address register. Depending on the implementation, the address is either serially loaded or captured directly from the PTB_ADDR inputs. The ATL_Address register is the same size, i.e., n+1 bits long, as would be required by an implementation with parallel PTB_ADDR inputs.

SELECT_PTB—The SELECT_PTB instruction is used to select a single PTB Bridge based on its assigned PTB Address. This instruction serially loads a PTB Address from the test controller into the Select_PTB register and compares it with the PTB_ADDR inputs to the PTB Bridge 802 (or when implemented, to its PTB_Address register, as loaded by the LOAD_PTB_ADDR instruction). The Select_PTB register is configured to be the same size, i.e., n+1 bits, as the PTB_ADDR inputs (or PTB_Address register). When the LOAD_PTB_ADDR instruction is not implemented, the SELECT_PTB instruction captures the PTB_ADDR inputs into the Select_PTB register (i.e., during Capture-DR before shifting in the PTB Address from the test controller).

If the PTB Address matches the PTB_ADDR inputs (or the PTB_Address register contents), then the PTB Bridge 802 becomes selected. When the PTB Bridge 802 is selected using the SELECT_PTB instruction, its TDO is enabled to drive onto the PTB and the DRs of the PTB Bridge 802 (e.g., the Bypass register, the Device_ID register, etc.) can be accessed. The PTB Bridge 802 remains selected until an UNSELECT_ALL or UNLINK_ALL instruction (described below) is issued, another instruction that does not select this PTB Bridge 802 is issued (e.g., a SELECT_ATL instruction that loads an ATL Address for a PTB Controller), or the PTB Bridge 802 is reset. Following a SELECT_PTB instruction, the test controller may issue another instruction such as the BYPASS or IDCODE instruction to verify that a PTB Bridge was selected and is therefore driving data onto the TDO of its PTB.

LINK_PTB—The LINK_PTB instruction causes the linking of two PTBs (e.g., the PTB_0 804.0 and PTB_1 804.1) connected via a PTB Bridge circuit (e.g., the PTB Bridge 802). Before the two PTBs 804.0–804.1 are linked, the PTB Bridge 802 for the source PTB_0 804.0 is selected first using the SELECT_PTB instruction. Following the LINK_PTB instruction, the TDO of the PTB Bridge 802 is enabled to drive onto the source PTB_0 804.0, and the TDO of the source PTB_0 804.0 and the TDI_LINK of the bridged PTB_1 804.1 are linked.

Linked PTBs remain selected and linked and the PTB Bridge circuits drive their TDO until they are unlinked with the UNLINK_ALL instruction (described below). Linked PTB cannot be unselected by instructions such as UNSELECT_ALL or SELECT_PTB, they are first unlinked. This allows multiple PTBs to remain linked to pass the PTB signals through to the next PTB in the link, so that the test controller may send instructions to the linked PTB Controllers. Further, it allows the TDO data from a selected UUT to be driven back to the test controller, i.e., through the PTB Bridge circuits.

UNLINK_ALL—The UNLINK_ALL instruction is used to unselect and unlink all of the PTB Bridge circuits. For example, loading the UNLINK_ALL instruction into the IR of the ATL of the PTB Bridge 802 unlinks the TDO of the source PTB_0 804.0 from the TDI_LINK of the bridged PTB_1 804.1 and disables the TDO of the PTB Bridge 802 from driving onto the PTB_0 804.0. In addition, all PTB Controllers become unselected, as occurs with the UNSELECT_ALL instruction. The UNLINK_ALL instruction selects the Bypass register, or optionally the Device_ID register if the IDCODE instruction is implemented.

Figure 14A:
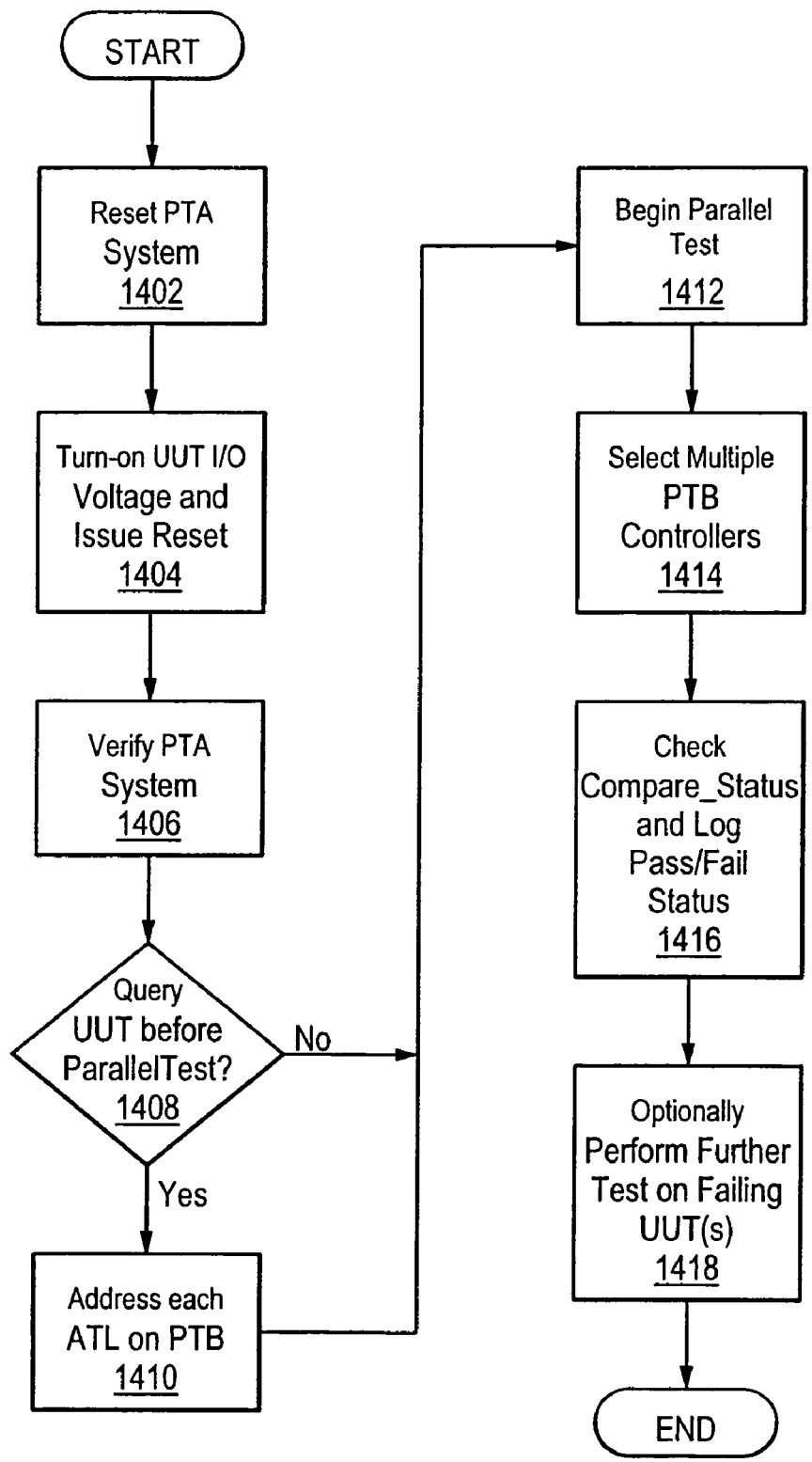
FIG. 14a is a flow diagram illustrating a method of performing parallel testing of a plurality of units under test using the parallel test architecture of FIG. 5, operative in a manner according to the present invention.

A first method of using the Parallel Test Architecture (PTA) 500 (see FIG. 5) to perform parallel testing of a plurality of Units Under Test (UUTs) is illustrated by reference to FIG. 14a. The method of FIG. 14a illustrates how the test controller communicates over the PTB with the PTB Controllers to access the UUTs and the various functions of the PTA.

As depicted in step 1402, the PTA system is reset. This is achieved by the test controller asserting the PTB's TRSTN to logic 0, or setting TMS to logic 1 for at least 5 TCK clock cycles. Each of the PTB Controllers enters Test-Logic-Reset and their IDCODE instruction (or BYPASS instruction if IDCODE is not implemented) is updated in the IR. Entering Test-Logic-Reset also causes the following events to occur:

The ATL's TDO output to the PTB and its TDO_UUT output is tri-stated, TMS_UUT is forced to logic 1 (i.e., TLR_Mode is loaded into the TMS_Control register), and TRSTN_UUT and TCK_UUT follow the TRSTN and TCK of the PTB, respectively.

The Compare_Status register is cleared, the Auto_Start register is reset so that START is disabled, and the IO_Voltage register is reset so that the interface voltage is off.

The Select_ATL, Select_Type, Group_Address, Select_Group, Alias_Address, Select_Alias and DIO_UUT registers are reset to all zeroes. All of the PTB Controllers are unselected and the DIO_UUT[n:0] lines become tri-stated.

Next, the UUT I/O voltage is turned-on and a reset is issued, as depicted in step 1404, to the UUTs. The SELECT_GROUP instruction can be used to select all of the PTB Controllers in the PTA system using the Group Addressing Mode. A Select_Group register value of all 0's may be used for this, as the Group_Address registers are reset to all 0's when the PTB is reset. Next, the test controller sets the interface voltage for the UUTs using the PROGRAM_IOV instruction. At this point, the test controller asserts TRSTN and provides at least 5 TCK clocks to assure that any of the UUTs that have not implemented a TRSTN are reset. All of the UUTs are reset at this point—either asynchronously through the TRSTN_UUT or by a TMS_UUT reset, as performed by the 5 TCK clocks above—and remain in Test-Logic-Reset.

The test controller then verifies, as depicted in step 1406, the PTA system. Specifically, the following events may occur:

The test controller can search through the ATL Address range, using the SELECT_ATL instruction, and verify the presence or absence of PTB Controllers at each address. The presence of a PTB Controller at a given ATL Address may be determined by first updating the ATL Address to be checked in the Select_ATL register. Next, the test controller moves the TAP controllers of the PTB Controllers through Capture-DR. This causes the ATL Address of the selected PTB Controller (if any is selected) to be captured into its Select_ATL register. The test controller then moves to Shift-DR and over scans the Select_ATL register using a special test pattern to verify scan path integrity. If a PTB Controller is selected, then the controller sees the particular ATL Address, followed by the scan test pattern, on the TDO of the PTB.

The test controller can perform any necessary testing of the PTA system once the presence of the PTB Controllers is determined.

When this step 1406 has completed, the test controller should leave all of the PTB Controllers unselected using the UNSELECT_ALL instruction, and should leave the PTA system in a state such that the Address registers of the ATL are set to their reset states and the UUTs are in Test-Logic-Reset. In addition, the test controller should report the PTA configuration and any faults or problems found in the PTA. If the PTA is functioning correctly, the test controller stores the configuration in a memory (not shown) included therein.

As depicted in step 1408, a decision is made as to whether the test controller queries the connected UUT prior to parallel testing or configuration of the circuit. In the event the test controller makes the query, the test controller addresses each ATL on the PTB, as depicted in step 1410. Specifically, the test controller selects each UUT using the SELECT_ATL instruction. In the event the test controller does not make the query, the test controller begins parallel testing or configuration of the UUTs, as depicted in step 1412. Specifically, if a LOAD_UUT_ID instruction has been implemented, then the UUT_ID registers of the UUTs can be loaded at this point, and the test controller may examine them. Next, the test controller controls the TMS_UUT output of the ATL to follow the TMS of the PTB using the TMS_CONTROL instruction and setting the TMS_Control register to TMS_Mode. This enables the UUT scan paths to be accessed via the ATL. The test controller can now examine the ID Register(s) of each of the UUTs, where implemented, and together with the UUT_ID register verify the UUT type and version. The test controller can then assign Group and Alias Addresses to the UUTs accordingly. The test controller leaves each of the UUTs in Run-Test/Idle and issue an UNSELECT_ALL instruction when done.

Next, the test controller performs parallel testing and/or configuration of the UUTs by first selecting multiple PTB Controllers, as depicted in step 1414. This is accomplished using one of the SELECT_TYPE, SELECT_GROUP, or SELECT_ALIAS instructions. Next, the TMS_CONTROL instruction is used set the control mode to TMS_Mode, so that the TMS_UUT outputs of the respective ATLs follow the TMS of the PTB. As a result, all of the previously selected UUTs are accessed in parallel. When the parallel test and configuration operations are complete, the test controller leaves the UUTs in Run-Test/Idle by setting the TMS_CONTROL to RTI_Mode, and issue an UNSELECT_ALL instruction.

Following a parallel test application, the test controller checks the Compare_Status register of each of the PTB Controllers and logs its pass/fail status, as depicted in step 1416. A PTB Controller's Compare_Status register should be cleared, in preparation for the next test, after being checked. After all Compare_Status registers have been checked, the test controller issues an UNSELECT_ALL instruction.

Once the pass/fail status of each of the UUTs is known, further debug and diagnosis may be done on the failing UUTs, as depicted in step 1418. The SELECT_ATL instruction is used to select the PTB Controller of a failing UUT, and then the TMS_CONTROL instruction is used to set the TMS control to TMS_Mode for accessing the UUT. The test controller can now reapply a failing test and examine the failing data on the TDO of the PTB for diagnostic purposes. When the UUTs are not being accessed, the UUT TAP Controllers should be placed in Run-Test/Idle by using the TMS_CONTROL instruction and setting the RTI_Mode. They can then remain in that state until they are accessed again for testing or configuration purposes.

Figure 14B:
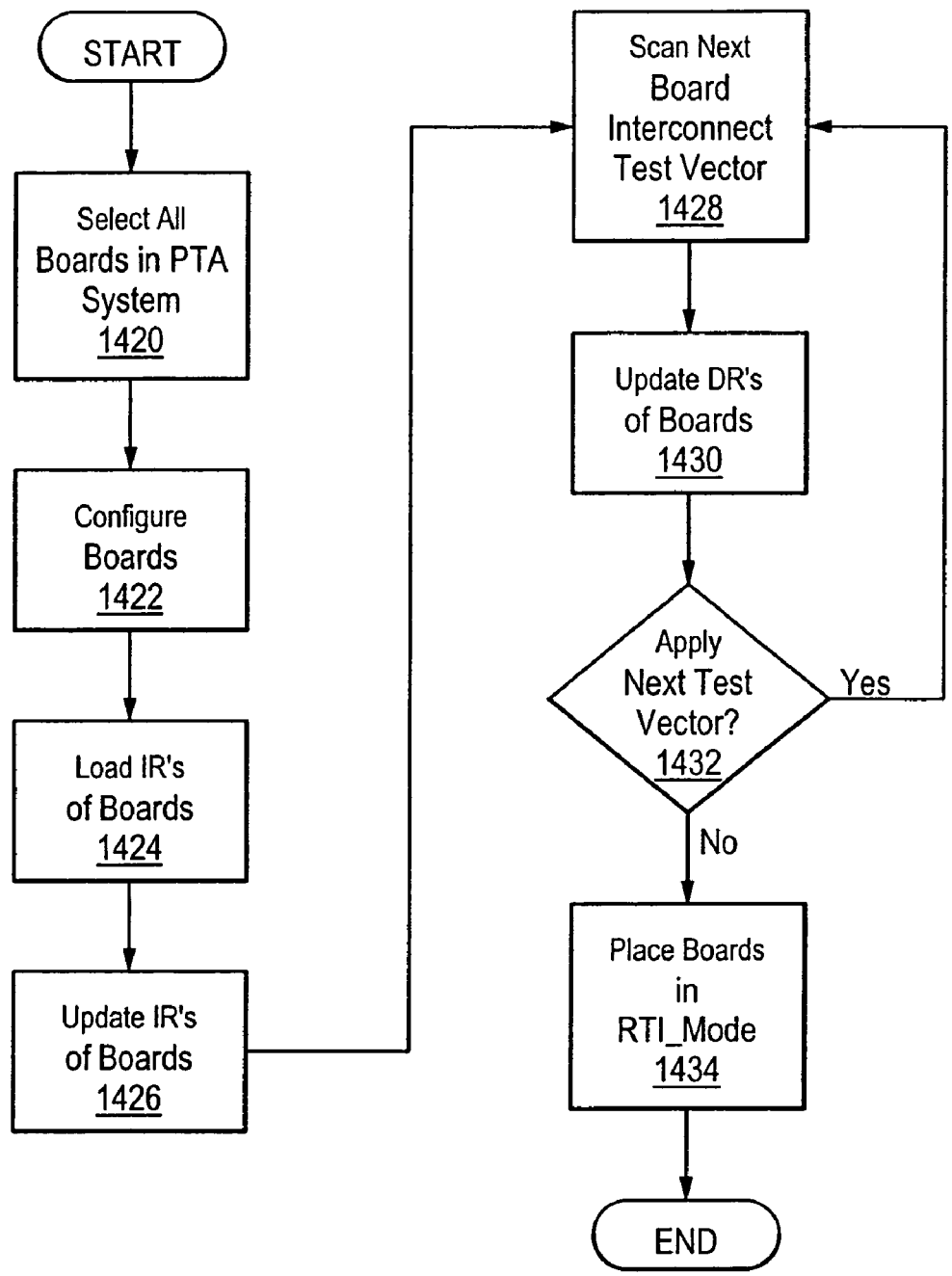
FIG. 14b is a flow diagram illustrating a method of performing board-to-board interconnect testing on a plurality of printed circuit boards in a backplane using the parallel test architecture of FIG. 5, operative in a manner according to the present invention.

A second method of using the Parallel Test Architecture (PTA) 500 (see FIG. 5) to perform board-to-board interconnect testing on a plurality of printed circuit board Units Under Test (UUTs) in a backplane is illustrated by reference to FIG. 14b. As depicted in step 1420, the test controller uses the SELECT_GROUP instruction to select all of the UUTs in the system, the TMS_CONTROL instruction to control the TMS outputs to RTI_Mode and move all UUT TAP Controllers to the Run-Test/Idle mode.

Next, the test controller configures the UUTs, as depicted in step 1422. Specifically, the test controller selects one of the UUTs that participates in the interconnect test using the SELECT_ATL instruction. The test controller then assigns an Alias Address with the PROGRAM_ALIAS instruction and sets the Unique_Alias bit. Next, the test controller assigns a Group Address of 1 using the PROGRAM_GROUP instruction. Step 1422 is then repeated for each UUT that is to participate in the interconnect test, with each new board being assigned a unique alias address.

As depicted in step 1424, the test controller initially loads the IRs of the UUTs. Specifically, the test controller selects one of the programmed boards using it's Alias Address, and uses the TMS_CONTROL instruction to set the TMS mode to RTI-Pause_ Mode. Next, the test controller transitions the ATL TAP Controller through Run-Test/Idle, which causes the TAP Controllers of the selected ATL and the UUT to become synchronized. The test controller then loads the IRs of the UUT with the EXTEST (or PRELOAD) instruction, and loads the ATL IR with SELECT_ALIAS. Next, the test controller transitions the UUT TAPs to Pause-IR. The UUT TAPs stay in Pause-IR, and the ATL goes to Run-Test/Idle. Step 1424 is then repeated for each board participating in the interconnect test. Accordingly, following step 1424, each UUT has been loaded with EXTEST and is waiting in Pause-IR.

Next, the test controller updates the IRs of the UUTs, as depicted in step 1426. Specifically, the test controller uses the SELECT_GROUP instruction with the programmed Group Address (e.g., Group Address 1) to select all boards participating in the interconnect test. Next, the test controller transitions the ATL TAP Controller through Capture-IR and then directly to Pause-IR. This causes the TAP Controllers of the selected ATLs and the respective UUTs connected to them to become synchronized. The test controller then transitions the ATL and UUT TAP Controllers to Update-IR. This causes a simultaneous IR update of all the UUTs. Following the update, go to Run-Test/Idle, which causes the UUT TAP controllers to remain there.

As depicted in step 1428, the test controller can now apply test vectors. Specifically, the test controller selects one of the UUTs using the SELECT_ALIAS instruction and then loading its Select_Alias Address register. It is noted that the test controller should avoid transitioning the ATL's TAP Controller through Run-Test/Idle to keep the UUT TAP Controller in Run-Test/Idle. Next, the test controller loads the ATL of the selected UUT with the BYPASS instruction, and transitions the ATL TAP Controller though Run-Test/Idle to synchronize the UUT TAP Controller with the ATL. The test controller then transitions the ATL and UUT TAP Controllers through Capture-DR and Shift-DR scanning the interconnect test vector. The test vector scan ends by going to Pause-DR, which causes the UUT TAP controller to remain there. Step 1428 is then repeated for each board participating in the interconnect test, with each UUT receiving the appropriate interconnect test vector. Accordingly, following step 1428, each UUT has been loaded with a test vector and is waiting in Pause-DR.

Next, the test controller updates the DRs of the UUTs, as depicted in step 1430. Specifically, the test controller uses the SELECT_GROUP instruction with the programmed Group Address (e.g., Group Address 1) to select all boards participating in the interconnect test. Next, the test controller transitions the ATL TAP Controller through Capture-DR and then directly to Pause-DR. This causes the TAP Controllers of the selected ATLs, and the respective UUTs connected to them, to become synchronized. The test controller then transitions the ATL and UUT TAP Controllers to Update-DR. This causes a simultaneous DR update of all of the UUTs. Following the update, go to Run-Test/Idle, which causes the UUT TAP controllers to remain there.

As depicted in 1432, a decision is made as to whether there is a next interconnect test vector to be applied by the test controller. If so, the flow loops back to step 1428. It is noted that for the first scan-in vector in step 1428, the initial Capture-DR data can be ignored. Following the final scan-out operation, the test sequence should end with step 1430, thereby updating a safe state in the BSR.

To end the board-to-board interconnect test, the test controller places the UUTs in the selected Group Address into RTI_Mode, as depicted in step 1434. Further, the test controller issues an UNSELECT_ALL instruction so that the UUT TAP Controllers remain in Run-Test/Idle until they are selected again.

Having described the above illustrative embodiments of the Parallel Test Architecture (PTA), it should be appreciated that other alternative embodiments or variations might be made. Examples of such alternative embodiments and variations are described below.

Alternative Embodiments of the ATL and PTB Controller

The PTB Controller 508 shown in FIG. 6 may be implemented with various other capabilities. For example, the ATL circuit 602 is capable of being adapted to interface to other circuits to facilitate testing of the UUT. Specifically, the PTB Controller 508 can be configured to access multiple scan paths on the UUT. The multiple scan paths may be accessed either in series or in parallel. When the scan paths are accessed in series, the PTB Controller 508 can provide scan path switching and linking capabilities between the ATL 602 and UUT. For parallel accessed scan paths, the ATL 602 may interface to serial-in/parallel-out and parallel-out/serial-in conversion circuits between the PTB Controller 508 and the UUT, or the ATL 602 may include these conversions as part of its circuitry. Further, the ATL 602 may be configured to control scan protocol other than IEEE 1149.1 on the UUT side, for example, multiplexed D flip-flop (DFF) or Level Sensitive Scan Design (LSSD). Further, the PTB Controller 508 may be implemented such that a single PTB Controller can access multiple UUTs. This would allow sharing of the ATL 602 on the PTB 504, yet still allow other PTB Controller functions to be dedicated to a single UUT such as the Mask and Compare and DIO circuits 604 and 606. Further, UUTs can still be accessed in parallel or individually, as with the embodiment shown in FIG. 6, where UUT selection is accomplished via a UUT_Select register and multiplexing of the TDI_UUT signals from the UUTs.

The Mask and Compare circuit 604 may also have various other functions. For example, a first fail detect signal may be implemented such that the Mask and Compare circuit 604 would signal the test controller 502 as soon as a scan data miscompare occurred. This signal may be implemented using the TDO line of the PTB 504, since it does not need to be used during parallel testing for comparing expected data. In this case, the PTB's TDO line would be driven to logic 0 by the Mask and Compare circuit 604 upon detection of a failure. Further, a fail-counter could be included in the Mask and Compare circuit 604 such that it would either count the scan bit or the number of scan bits that failed during compare operations.

The Mask and Compare circuit 604 may additionally include a signature register for compacting response data from the UUT. This may be implemented either as a Serial or Multiple Input Signature Register (SISR or MISR, respectively). In this case, the signature would be checked for pass/fail following a test of the UUT. It is noted that the EDI line is not used during signature testing, however the MDI line may be used to mask indeterminate responses that would be input to the SISR or MISR, thereby enabling a deterministic signature to be obtained.

Further, in other embodiments of the PTA 500, the PTB Controller 508 may include a pattern generation circuit such as a Linear Feedback Shift Register (LFSR), which can be used to supply test patterns to the UUT. By providing an LFSR and a SISR/MISR, the PTB Controller 508 can effectively apply a Built-In Self-Test (BIST) to the UUT. Further, the PTB 504 may also include an XDI (eXtended Data In) signal, which may be used to select scan-in data to the UUT from either the LFSR or the PTB's TDI signal. Accordingly, the XDI line can "mask" the TDI data of the PTB 504 (where the masked data is provided with random data from the LFSR).

In a further alternative embodiment of the PTA 500, one or more of the DIO_UUT lines may be automatically controlled or continually polled by the ATL 602, for example, as programmable clocks or interrupts that can be used by the UUT for testing or programmable configuration purposes. Where programmable interrupts are provided, the ATL 602 may continuously monitor the states of the DIO_UUT lines and subsequently signal back to the test controller 502 on the PTB's TDO when an interrupt event has occurred. Further, TAP controller instructions in addition to those described above may be provided in the ATL 602 to support other extensions to the PTA 500.

Alternative Embodiments of the PTB

It should be understood that the PTB 504 is not limited to a specific set of signals or a particular bus implementation, and may have various other embodiments in addition to those shown in FIGS. 5–6, 8, and 10–13. The PTB 504 may be implemented with various other capabilities depending upon, e.g., the particular parallel test application, the number of UUTs, and/or the cost and performance requirements for parallel communication to multiple UUTs.

For example, further embodiments of the PTB 504 may include additional signals to facilitate auxiliary testing, debugging, or configuration capabilities for the UUTs 506.1–506.n. Signals such as a high-speed system clock for the UUTs 506.1–506.n., a master clock for the PTB 504, signals for support of analog test and measurements (as described below) or the XDI signal are such examples.

The structural and electrical configuration of the PTB 504 may also vary to suit the particular implementation. For example, as new circuit technology becomes available, new PTB implementations may enable higher speeds and/or longer transmission distances. Specifically, by configuring the PTB to use Low Voltage Differential Signaling (LVDS) bus technology, the PTB signals may be implemented as differential signal pairs to achieve a high-performance PTB. Further, the PTB 504 may be implemented at various levels of integration. For example, it may be implemented on a PCB, as part of a system backplane, or through cabling provided from a PTA tester to the UUTs 506.1–506.n.

Figure 7:
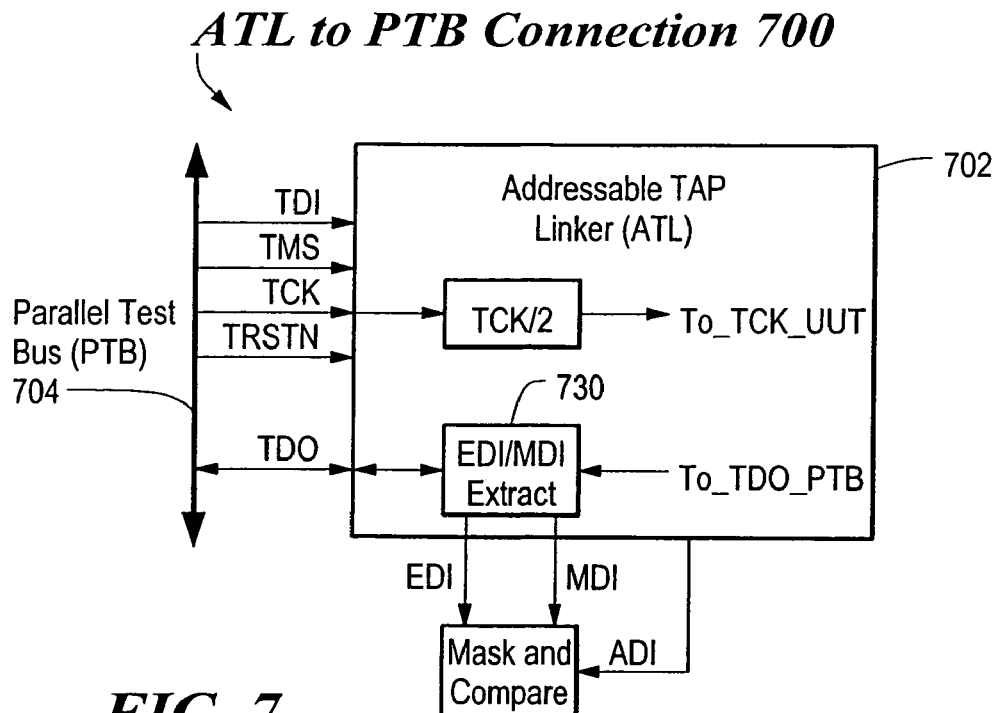
FIG. 7 is a block diagram depicting an addressable TAP linker included in the parallel test bus controller of FIG. 6.

In a further alternative embodiment, the PTB 504 may be implemented with a reduced number of physical PTB lines or wires. To illustrate this, FIG. 7 shows an alternative connection 700 of an Addressable TAP Linker (ATL) 702 to a Parallel Test Bus (PTB) 704. As shown in FIG. 7, the EDI and MDI lines are multiplexed on the TDO line of the PTB 704. This is possible as the TDO line is not normally used in conjunction with the EDI and MDI lines during parallel test and verification, but when actual scan-out data is sent back to the test controller on the PTB 704. In the PTB 704, the TDO line is implemented as a bi-directional signal. TDO functions as an input to the ATL 702 during parallel testing and as an output from the ATL 702 when actual TDO data is being sent back to the test controller. During a parallel test application, both the EDI and MDI signals are sent across the single TDO wire of FIG. 7, in different PTB clock cycles, and they are then extracted by an EDI/MDI Extract circuit 730 included in the ATL 702. This requires that the TCK clock rate of the PTB 704 be twice that (i.e., 2x) of the UUTs. Thus, data is transmitted to and received from the UUTs at half the rate of a PTB with separate EDI and MDI lines. This may result in reduced implementation costs. Where the application and technology permit, other embodiments of the PTB may reduce the physical wiring further. In addition, as technology permits, a PTB implemented using wireless communications is also achievable and would provide additional benefits in terms of access to multiple UUTs in parallel.

A further alternative embodiment of the PTA 500 (see FIG. 5) can be implemented using multiple PTBs 504 between the test controller 502 and the PTB Controllers 508.1–508.n. For example, two independent PTBs could be used, in which a first PTB connects to a respective PTB Controller and is used for accessing the UUT connected thereto and a second, i.e., separate, PTB also connects to the same PTB Controller and is dedicated for use in accessing the DIO of that PTB Controller. This provides for higher overall throughput of the PTA by providing multiple scan data streams in parallel.

PTA with Analog Test Capability

Figure 1:
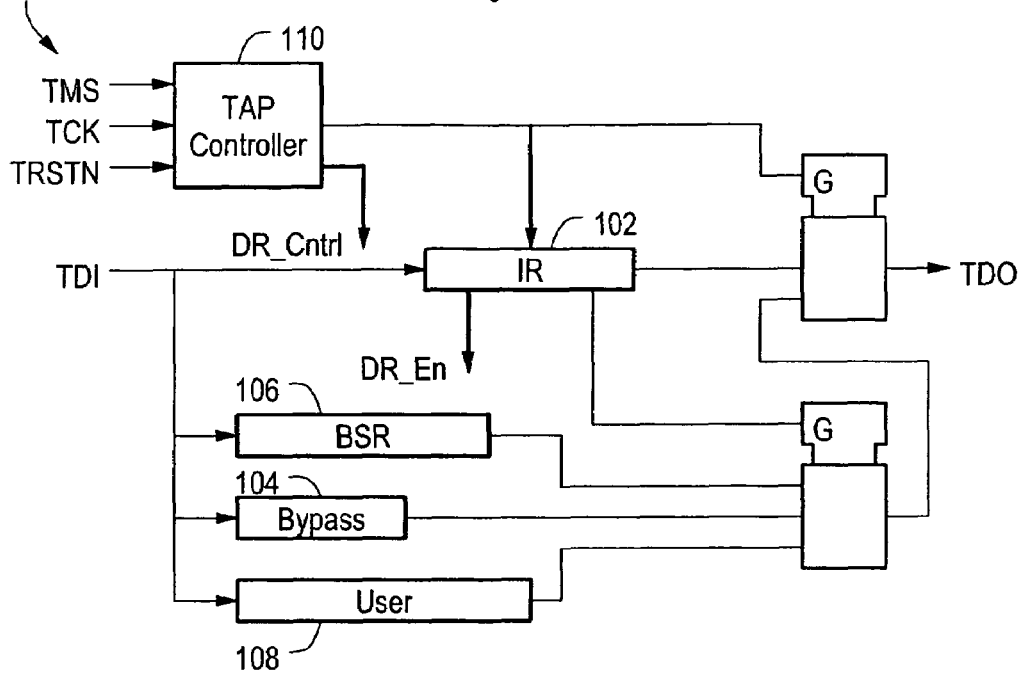
FIG. 1 is a block diagram depicting a conventional IEEE 1149.1 Test Access Port (TAP) and Boundary Scan Architecture.
Figure 2:
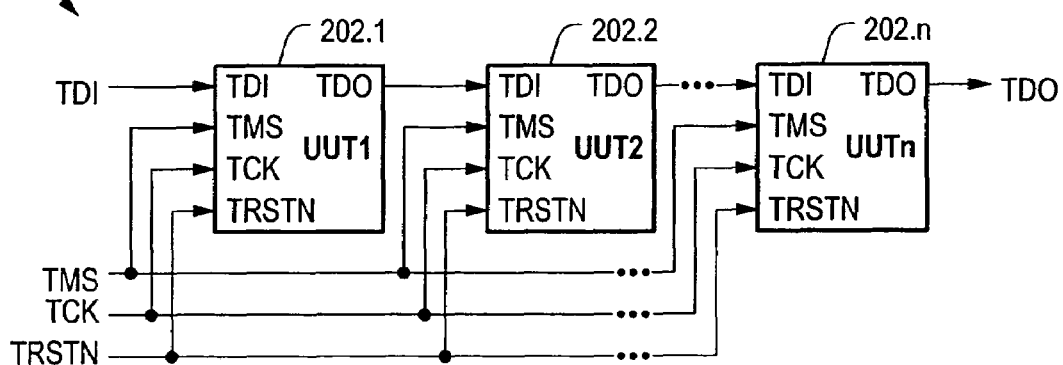
FIG. 2 is a block diagram depicting a conventional daisy chained configuration of an IEEE 1149.1 bus.
Figure 3:
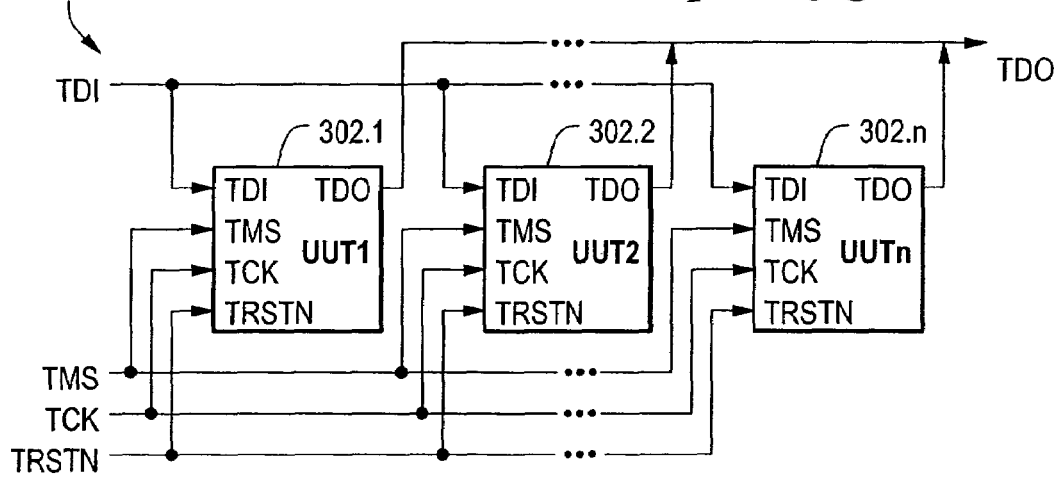
FIG. 3 is a block diagram depicting a conventional multi-drop configuration of the IEEE 1149.1 bus.
Figure 4:
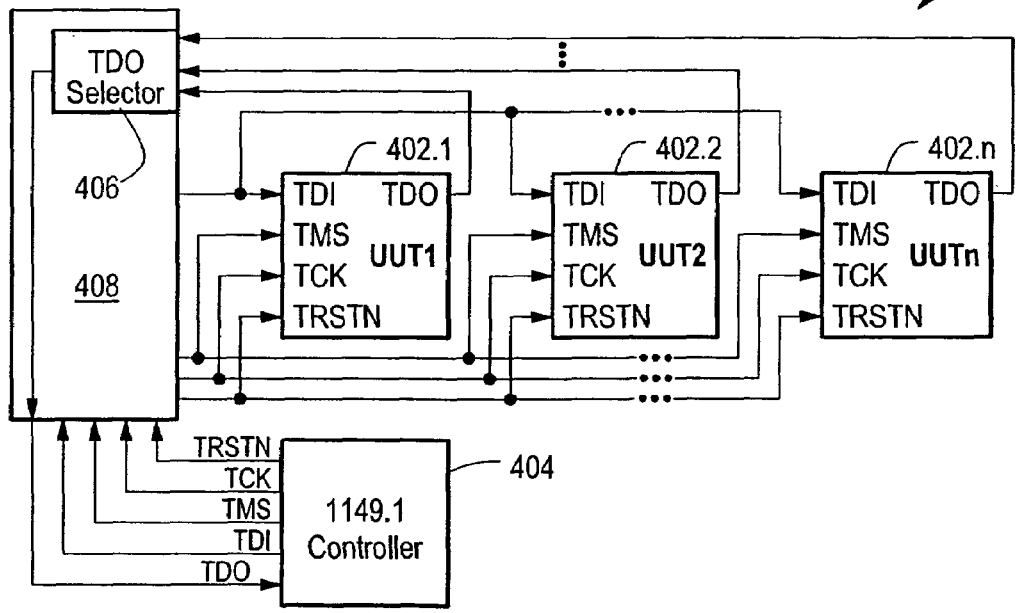
FIG. 4 is a block diagram depicting a conventional ganged access scan multiplier configuration of the IEEE 1149.1 bus.
Figure 12:
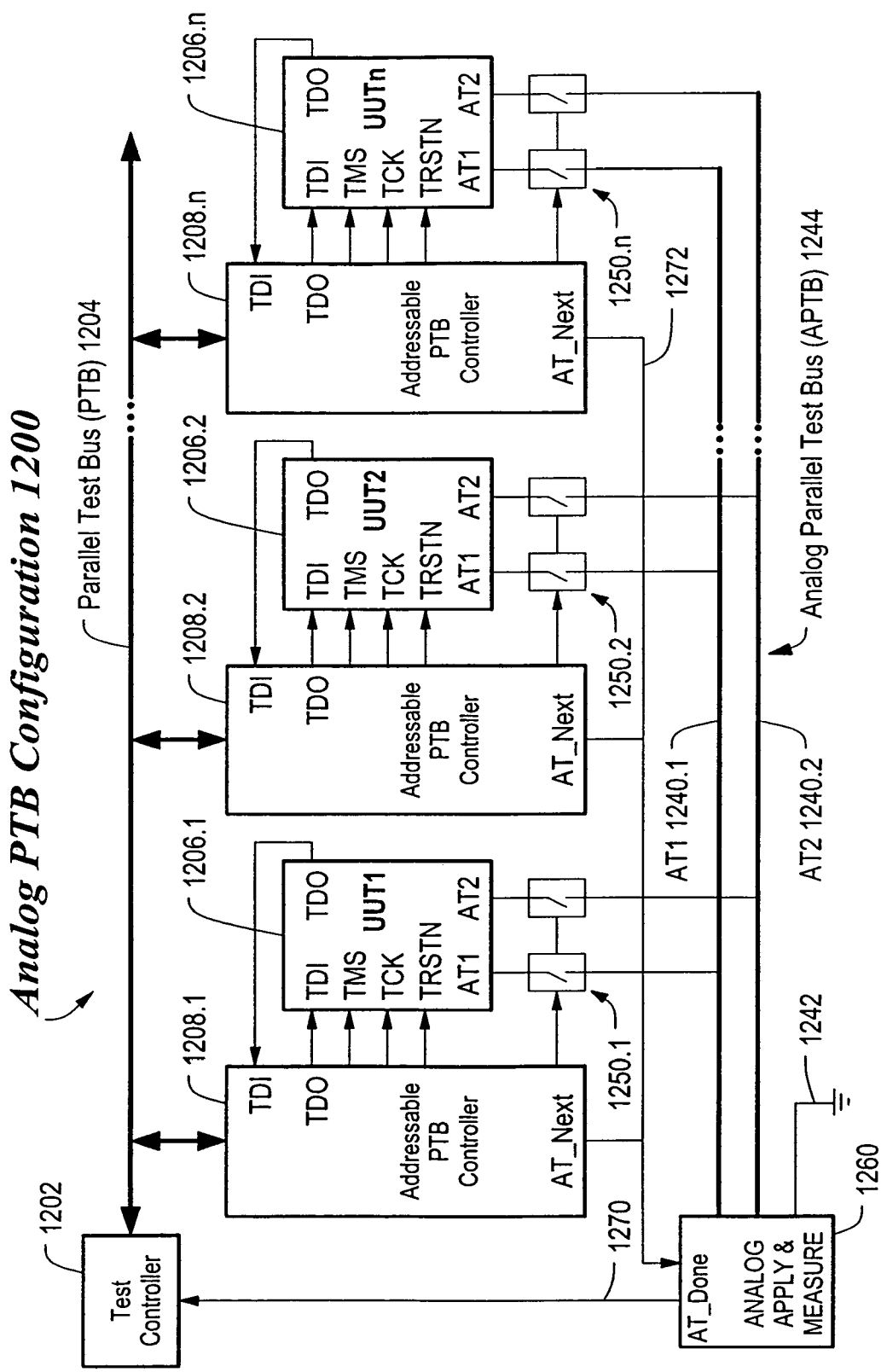
FIG. 12 is a block diagram depicting the parallel test architecture of FIG. 5 including a parallel test bus configuration that supports analog testing.
Figure 13:
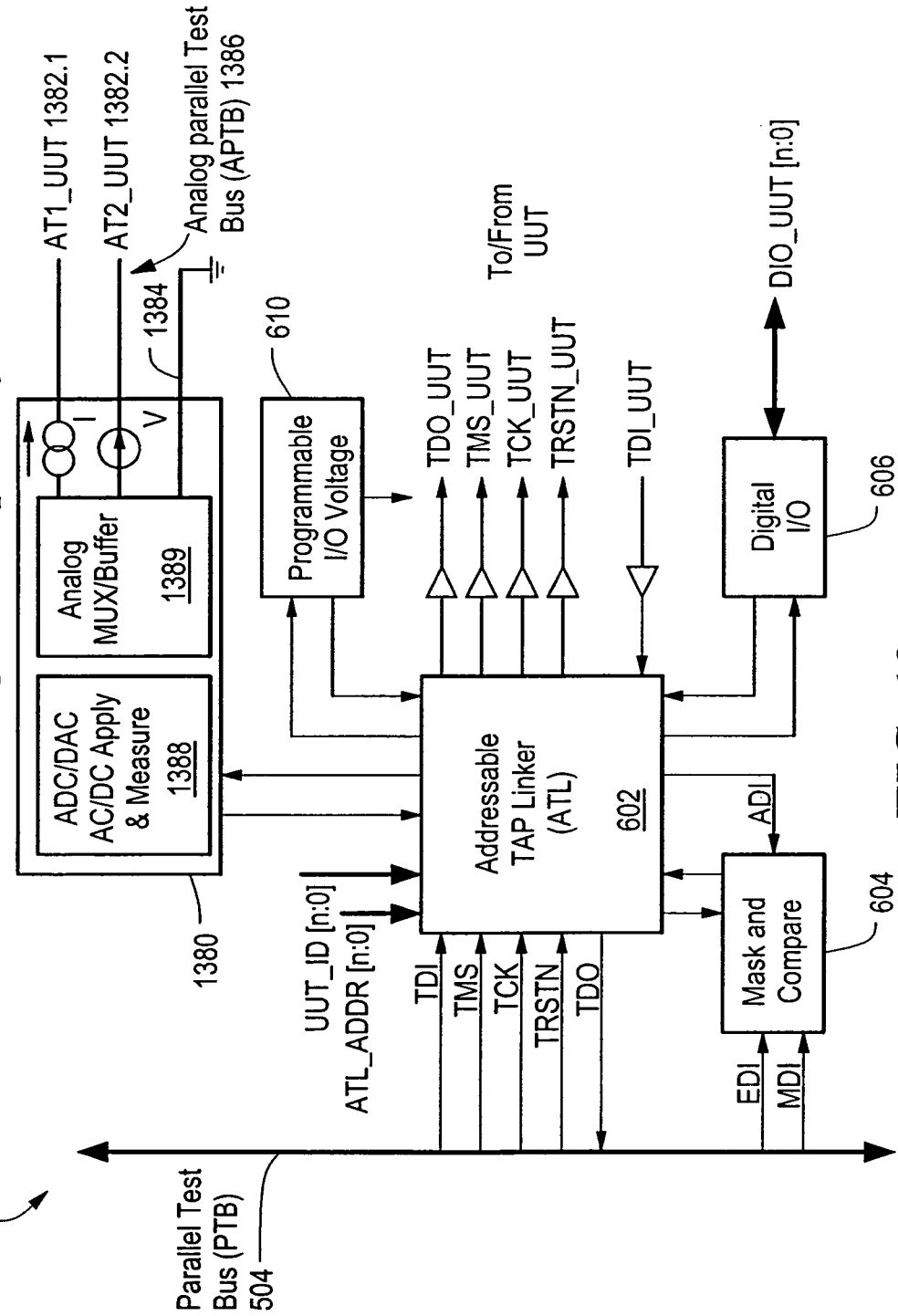
FIG. 13 is a block diagram depicting the addressable TAP linker of FIG. 6 configured to support analog testing.

The PTA 500 (see FIG. 5) can be extended beyond testing digital circuits and may additionally provide mixed-signal (i.e., both analog and digital circuits) testing capabilities. FIGS. 12–13 show two alternative embodiments 1200 and 1300, respectively, of a PTA that support analog testing using the IEEE 1149.4 Mixed Signal Test Bus standard described in the IEEE 1149.4 Mixed-Signal Test Bus Standard specification, which is incorporated herein by reference. In addition to the IEEE 1149.1 TAP signals, as shown in FIGS. 1–3, the IEEE 1149.4 standard includes two analog bus signals, AT1 and AT2, which are the two mandatory analog pins for the IEEE 1149.4 Analog Test Access Port (ATAP). AT1 is an analog input pin to the UUT used to apply a constant stimulus current to the UUT, and AT2 is an analog output from the UUT used to measure the resultant voltage.

The IEEE 1149.4 standard was developed as an extension to the IEEE 1149.1 standard to include the AT1/AT2 analog test bus and ATAP. The IEEE 1149.4 standard was designed to utilize the standard IEEE 1149.1 architecture as an infrastructure, for example, using the EXTEST instruction for analog interconnect testing. It further defines new Analog Boundary Modules (ABMs) for the Boundary Scan register, which provide for analog test and measurement capabilities via the AT1/AT2 analog test bus. The IEEE 1149.4 standard is primarily intended to provide for testing of manufacturing-related interconnect defects for analog signals and components (e.g., shorts, opens, or a wrong value component was loaded). However, the AT1/AT2 analog test bus can also be used to provide an analog measurement capability, e.g., impedance measurements of resistive components or DC parametric testing. Internal chip testing is also possible using the IEEE 1149.4 standard, for example, internal test of an embedded analog core.

Due to the nature of applying an analog stimulus and measuring the resultant response, analog test and measurement is relatively slow and time consuming when compared to digital testing. For example, a simple analog test requires that a DC or AC current or voltage be applied to the circuit under test as the test stimulus, and then the resultant analog response be measured and analyzed. This normally requires that analog instrumentation or ATE first be switched into the circuit under test and then controlled to apply and measure the appropriate analog test. The switching and subsequent operation of the analog instrumentation generally takes on the order of several milliseconds per test/measurement. This is in contrast to digital testing, which can be accomplished in many orders of magnitude less time. As such, parallel analog test, e.g., during board manufacturing test or during wafer probe testing, is needed. For example, this analog test capability may be used to provide DC parametric testing of digital I/O or for monitoring and characterizing semiconductor manufacturing processes. In this case, rather than the typical discrete transistor structures and wafer probe pads used between die on a silicon wafer, the test structures may be placed on-chip and accessed using the IEEE 1149.4 standard.

FIG. 12 depicts the Analog Parallel Test Bus (APTB) configuration 1200, which illustrates how the PTB can be extended to provide additional IEEE 1149.4 analog test bus signals, AT1 1240.1 and AT2 1240.2. FIG. 12 shows, in addition to a digital PTB 1204, the AT1 and AT2 lines 1240.1–1240.2 and an analog common ground 1242 coupled to an Analog Apply and Measure instrumentation unit 1260. The AT1 and AT2 lines 1240.1 and 1240.2 are shown as separate busses in FIG. 12 for clarity of discussion, but are generally considered to be a combined bus that makes up the APTB 1244. The AT1 and AT2 lines 1240.1–1240.2 are connected to the AT1 and AT2 signals of each UUT 1206.1–1206.n through respective analog switches 1250.1–1250.n. It is noted that the analog unit 1260 may be implemented separate from or combined with a digital test controller 1202. For clarity of discussion, FIG. 12 depicts the analog unit 1260 and the test controller 1202 as analog and digital sections, respectively, of the analog PTB configuration 1200. FIG. 12 also shows a communications link 1270 between the analog unit 1260 and the test controller 1202. The Analog Apply and Measure instrumentation unit 1260 can signal the test controller 1202 that an analog test is completed using the AT_Done signal, and PTB Controllers 1208.1–1208.n can signal the analog unit 1260 to start the next analog test via the AT_Next signal on line 1272. The AT_Next signal is controlled when a PTB Controller is selected and an analog test has been set up for the UUT connected thereto.

In this way, the analog unit 1260 and the test controller 1202 can work in an automated fashion to apply and measure analog tests on each of the UUTs 1206.1–1206.n. The PTB Controllers 1208.1–1208.n also provide for automatic control of the respective analog switches 1250.1–1250.n that connect the AT1 and AT2 lines 1240.1–1240.2 of the APTB to the UUTs 1206.1–1206.n. It is noted that the digital set up for analog testing is normally performed in parallel on a number of the UUTs 1206.1–1206.n, while the apply and measure operations are normally done serially for each UUT.

FIG. 13 depicts a PTB Controller 1300 that includes the ATL 602 connected to the PTB 504, the mask and compare circuit 604, the digital I/O circuit 606, and the programmable I/O voltage circuit 610, each of which is described above with reference to FIG. 6. The PTB Controller 1300 further includes an analog test circuit 1380, which provides the PTB Controller 1300 with an analog test capability. With the addition of the analog test circuit 1380, the PTB Controller 1300 provides an AT1_UUT signal 1382.1, an AT2_UUT signal 1382.2, and a common ground 1384 for analog testing of the UUT connected thereto. As such, an IEEE 1149.4 analog test bus 1386 comprising the AT1_UUT/AT2_UUT signals 1382.1–1382.2 and the analog common ground 1384 can be made directly available from each PTB Controller on the multi-drop PTB 504. Further, the IEEE 1149.4 test bus 1386 is provided for each UUT in parallel instead of sharing the single APTB 1244, as shown in FIG. 12.

The analog test circuit 1380 (see FIG. 13) communicates with the ATL 602 through a digital interface, thereby allowing the analog test circuit 1380 to be directly controlled over the PTB 504 by the test controller, i.e., without requiring access via the APTB 1386 or an analog section such as the Analog Apply and Measure instrumentation unit 1260. Thus, for the PTB Controller 1300, the AT1 and AT2 signals 1240.1–1240.2 and the analog unit 1260 are not present, and the PTB 504 and the test controller 502 employed with the PTB Controller 1300 are identical to the corresponding elements of the PTA 500 shown in FIG. 5.

The analog test circuit 1380 (see FIG. 13) includes an Analog-to-Digital Conversion (ADC) and a Digital-to-Analog Conversion (DAC) circuit 1388, which enables the "apply" and "measure" functions of the analog test to be converted from/to digital data and therefore all analog testing can be accomplished in the same manner as other digital tests of the UUT using only the digital test controller on the PTB 504. The analog test circuit 1380 is configured to apply a DC or AC current to the UUT on the AT1_UUT signal 1382.1, as controlled by the DAC circuit 1388. Further, the analog test circuit 1380 can measure a resultant UUT voltage on the AT2_UUT line 1382.2, which is subsequently converted from analog to digital form. The analog test circuit 1380 further includes an analog multiplexor 1389, which provides for a voltage measurement to be taken at AT2 1382.2 of a known load at AT1 1382.1, thereby enabling calibration of the AT1/AT2 bus. The Parallel Test Architecture (PTA) comprising a plurality of the PTB Controllers 1300 allows analog tests to be performed in parallel (i.e., simultaneously on multiple UUTs) by utilizing digital conversions of the apply and measure operations in conjunction with the parallel test capability of the PTB 504 and the PTB Controller 1300.

It will further be appreciated by those of ordinary skill in the art that modifications to and variations of the above-described parallel test architecture may be made without departing from the inventive concepts disclosed herein.

Accordingly, the invention should not be viewed as limited except as by the scope and spirit of the appended claims.

What is claimed is:

1. A system for accessing one or more electronic circuits for testing, debugging, or programmably configuring the electronic circuits, comprising:
   a test bus;
   a first test resource connected to the test bus; and
   a plurality of controllers connected to the test bus, each controller being coupleable to a respective electronic circuit to be accessed,
   wherein the first test resource is configured to send at least one first signal over the test bus to respective controllers to access, substantially in parallel, the electronic circuits via the respective controllers,
   wherein each controller is configured to employ a first protocol to access the respective electronic circuit coupleable thereto based on the at least one first signal sent over the test bus by the first test resource, and
   wherein the first test resource is further configured to send at least one expected-data signal to the respective controllers, the expected-data signal being indicative of data expected to be received from the electronic circuits as a result of being accessed by the respective controllers.

2. The system of claim 1 wherein each controller includes an interface compatible with the IEEE 1149.1 test standard, each controller being further configured to employ the protocol given in the IEEE 1149.1 test standard to access the respective electronic circuit coupleable thereto.

3. The system of claim 1 wherein the first test resource includes an interface compatible with the IEEE 1149.1 test standard.

4. The system of claim 1 wherein the test bus comprises a multidrop test access bus, and each electronic circuit to be accessed includes a respective test access bus.

5. The system of claim 4 wherein each controller is further configured to link the multidrop test access bus to the respective test access bus included in the electronic circuit coup leable thereto.

6. The system of claim 1 wherein the test bus is compatible with the IEEE 1149.1 test standard.

7. The system of claim 1 wherein each controller is further configured to receive at least one actual-data signal from the respective electronic circuit as a result of being accessed, and to compare the actual-data signal to the expected-data signal.

8. The system of claim 7 wherein the respective controllers are further configured to store resultant data as a result of the comparison.

9. The system of claim 8 wherein the first test resource is further configured to retrieve the stored resultant data.

10. The system of claim 7 wherein the respective controllers are further configured to compact the actual-data signal.

11. The system of claim 7 wherein each controller is further configured provide resultant data over the test bus to the first test resource as a result of the comparison.

12. The system of claim 1 wherein each controller is further configured to provide resultant data over the test bus to the first test resource as a result of accessing the respective electronic circuit.

13. A system for accessing one or more electronic circuits for testing, debugging, or programmably configuring the electronic circuits, comprising:
   a test bus;
   a first test resource connected to the test bus; and
   a plurality of controllers connected to the test bus, each controller being coupleable to a respective electronic circuit to be accessed,
   wherein the first test resource is configured to send at least one first signal over the test bus to respective controllers to access, substantially in parallel, the electronic circuits via the respective controllers,
   wherein each controller is configured to employ a first protocol to access the respective electronic circuit coupleable thereto based on the at least one first signal sent over the test bus by the first test resource, and
   wherein the test bus comprises a digital test bus, and the system further includes an analog test bus, a second test resource, and a communication link configured to couple the second test resource to the first test resource, the analog test bus being coupled to the second test resource and coupleable to the respective electronic circuits to be accessed.

14. The system of claim 13 wherein the second test resource is configured to employ a second protocol to access the respective electronic circuits based on at least one second signal sent over the digital test bus by the first test resource.

15. The system of claim 13 wherein the second test resource includes an interface compatible with the IEEE 1149.4 test standard, the second test resource being further configured to employ the protocol given in the IEEE 1149.4 test standard to access the respective electronic circuits.

16. A system for accessing one or more electronic circuits for testing, debugging, or programmably configuring the electronic circuits, comprising:
   a test bus;
   a first test resource connected to the test bus; and
   a plurality of controllers connected to the test bus, each controller being coupleable to a respective electronic circuit to be accessed,
   wherein the first test resource is configured to send at least one first signal over the test bus to respective controllers to access, substantially in parallel, the electronic circuits via the respective controllers,
   wherein each controller is configured to employ a first protocol to access the respective electronic circuit coupleable thereto based on the at least one first signal sent over the test bus by the first test resource, and
   wherein each controller is further configured to receive at least one actual-data signal from the respective electronic circuit as a result of being accessed, and the first test resource is further configured to send at least one mask-data signal to the respective controllers, the mask-data signal being operative to mask at least a portion of the actual-data signal.

17. The system of claim 16 wherein each controller is further configured to provide resultant data over the test bus to the first test resource as a result of accessing the respective electronic circuit.

18. A system for accessing one or more electronic circuits for testing, debugging, or programmably configuring the electronic circuits, comprising;
   a test bus;
   a first test resource connect6d to the test bus; and
   a plurality of controllers connected to the test bus, each controller being coupleable to a respective electronic circuit to be accessed,
   wherein the first test resource is configured to send at least one first signal over the test bus to respective controllers to access, substantially in parallel, the electronic circuits via the respective controllers, wherein each controller is configured to employ a first protocol to access the respective electronic circuit coupleable thereto based on the at least one first signal sent over the test bus by the first test resource, and wherein each controller is further configured to provide at least one input-data signal to the respective electronic circuit coupleable thereto, and the first test resource is further configured to send at least one mask-data signal to the controller, the mask-data signal being operative to mask at least a portion of the input-data signal.

19. The system of claim 18 wherein the respective controllers are further configured to generate at least a portion of the input-data signal.

20. The system of claim 18 wherein each controller is further configured to provide resultant data over the test bus to the first test resource as a result of accessing the respective electronic circuit.

21. A system for accessing one or more electronic circuits for testing, debugging, or programmably configuring the electronic circuits, comprising:
 a test bus;
 a first test resource connected to the test bus; and
 a plurality of controllers connected to the test bus, each controller being coupleable to a respective electronic circuit to be accessed,
 wherein the first test resource is configured to send at least one first signal over the test bus to respective controllers to access, substantially in parallel, the electronic circuits via the respective controllers,
 wherein each controller is configured to employ a first protocol to access the respective electronic circuit coupleable thereto based on the at least one first signal sent over the test bus by the first test resource, and
 wherein each controller includes a digital input/output circuit configured to convey one or more digital signals between the controller and the respective electronic circuit based on at least one second signal sent over the test bus by the first test resource.

22. The system of claim 21 wherein the first test resource is configured to send at least one expected-data signal to the respective controllers, the at least one expected-data signal being indicative of data expected to be sent to the respective digital input/output circuits by the electronic circuits as a result of being accessed by the respective controllers.

23. The system of claim 22 wherein the respective controllers are further configured to receive at least one actual-data signal from the electronic circuit coupleable thereto, and to compare the actual-data signal to the expected data signal.

24. The system of claim 23 wherein the respective controllers are further configured to store resultant data as a result of the comparison.

25. The system of claim 24 wherein the first test resource is further configured to retrieve the stored resultant data.

26. The system of claim 23 wherein the respective controllers are further configured to compact the actual-data signal.

27. The system of claim 23 wherein the respective controllers are further configured to provide resultant data over the test bus to the first test resource as a result of the comparison.

28. The system of claim 21 wherein the respective controllers are further configured to receive at least one actual-data signal from the electronic circuit coupleable thereto, the first test resource being further configured to send at least one mask-data signal to the respective controllers, the mask-data signal being operative to mask at least a portion of the actual-data signal.

29. The system of claim 21 wherein each controller is configured to provide at least one input-data signal to the respective electronic circuit coupleable thereto, and the first test resource is further configured to send at least one mask-data signal to the controller, the mask-data signal being operative to mask at least a portion of the input-data signal provided to the respective electronic circuit by the controller.

30. The system of claim 29 wherein the respective controllers are further configured to generate at least a portion of the input-data signal.

31. A system for accessing one or more electronic circuits for testing, debugging, or programmably configuring the electronic circuits, comprising:
 a test bus;
 a first test resource connected to the test bus; and
 a plurality of controllers connected to the test bus, each controller being coupleable to a respective electronic circuit to be accessed,
 wherein the first test resource is configured to send at least one first signal over the test bus to respective controllers to access, substantially in parallel, the electronic circuits via the respective controllers,
 wherein each controller is configured to employ a first protocol to access the respective electronic circuit coupleable thereto based on the at least one first signal sent over the test bus by the first test resource, and
 wherein each controller includes an auto start circuit configured to send a start signal over the test bus from the controller to the first test resource, the start signal being operative to indicate to the first test resource that the respective electronic circuits to be accessed are coupled to the controllers, thereby enabling the first test resource to provide the at least one first signal to access, substantially in parallel, the electronic circuits via the respective controllers.

32. A system for accessing one or more electronic circuits for testing, debugging, or programmably configuring the electronic circuits, comprising:
 a test bus;
 a first test resource connected to the test bus; and
 a plurality of controllers connected to the test bus, each controller being coupleable to a respective electronic circuit to be accessed,
 wherein the first test resource is configured to send at least one first signal over the test bus to respective controllers to access, substantially in parallel, the electronic circuits via the respective controllers,
 wherein each controller is configured to employ a first protocol to access the respective electronic circuit coupleable thereto based on the at least one first signal sent over the test bus by the first test resource, and
 wherein each controller includes a communication interface having an associated voltage level coupleable to the respective electronic circuit to be accessed, and a programmable input/output voltage circuit configured to set the voltage level of the communication interface to assure electrical compatibility with the respective electronic circuit.

33. The system of claim 32 wherein the programmable input/output voltage circuit sets the voltage level of the communication interface based on at least one second signal sent over the test bus by the first test resource.

34. A system for accessing one or more electronic circuits for testing, debugging, or programmably configuring the electronic circuits, comprising:
   a test bus;
   a first test resource connected to the test bus; and
   a plurality of controllers connected to the test bus, each controller being coupleable to a respective electronic circuit to be accessed,
   wherein the first test resource is configured to send at least one first signal over the test bus to respective controllers to access, substantially in parallel, the electronic circuits via the respective controllers,
   wherein, each controller, is configured to employ a first protocol to access the respective electronic circuit coupleable thereto based on the at least one first signal sent over the test bus by the first test resource, and
   wherein the test bus comprises a plurality of test buses, and respective pluralities of controllers are connected to the test buses, and further including at least one bus bridge configured for successively interconnecting the test buses.

35. The system of claim 34 wherein the bus bridge interconnects a first test bus and a second test bus, the first test bus being a source bus.

36. The system of claim 34 wherein the bus bridge interconnects a first test bus and a second test bus, each of the first and second test buses being configured to convey test data, the bus bridge being configured to convey the test data between the first test bus and the second test bus.

37. A system for accessing one or more electronic circuits for testing, debugging, or programmably configuring the electronic circuits, comprising:
   a test bus;
   a first test resource connected to the test bus; and
   a plurality of controllers connected to the test bus, each controller being coupleable to a respective electronic circuit to be accessed,
   wherein the first test resource is configured to send at least one first signal over the test bus to respective controllers to access, substantially in parallel, the electronic circuits via the respective controllers,
   wherein each controller is configured to employ a first protocol to access the respective electronic circuit coupleable thereto based on the at least one first signal sent over the test bus by the first test resource, and
   wherein the first test resource is configured to store data denoting a plurality of modes for addressing the plurality of controllers, and to execute at least one application to address at least one of the plurality of controllers according to one of the addressing modes.

38. The system of claim 37 wherein each controller has an associated address value, and in one of the addressing modes the test resource addresses a single controller based on its associated address value.

39. The system of claim 37 wherein each controller has an associated identification value, and in one of the addressing modes the test resource addresses one or more of the plurality of controllers based on their associated identification values.

40. The system of claim 37 wherein each controller has an associated group address value, and in one of the addressing modes the test resource addresses respective controllers having the same group address value.

41. The system of claim 37 wherein at least one of the plurality of controllers has an associated alias address value, and in one of the addressing modes the test resource addresses at least one controller based on its associated alias address value.

42. A test bus architecture for accessing one or more electronic circuits for testing, debugging, or programmably configuring the electronic circuits, comprising:
   a test bus;
   a first test resource connected to the test bus; and
   a plurality of controllers connected to the test bus, each controller being coupleable to a respective electronic circuit to be accessed,
   wherein the test bus is configured to convey at least one first signal from the first test resource to respective controllers to access, substantially in parallel, the electronic circuits via the respective controllers, and
   wherein the test bus is further configured to convey at least one expected-data signal from the first test resource to the respective controllers, the expected-data signal being indicative of data expected to be received from the electronic circuits as a result of being accessed by the respective controllers.

43. The test bus architecture of claim 42 wherein the respective ports of the electronic circuits to be accessed are compatible with IEEE 1149.1 test standard.

44. The test bus architecture of claim 42 wherein the test bus comprises a multidrop test access bus.

45. The test bus architecture of claim 42 wherein the test bus is compatible with the IEEE 1149.1 test standard.

46. The test bus architecture of claim 42 wherein the test bus is further configured to convey at least one test access signal between the first test resource and the plurality of controllers, the at least one test access signal being selected from a signal group including a test clock signal, a test mode select signal, a test data input signal, a test data output signal, and a test reset signal.

47. The test bus architecture of claim 42 wherein the respective controllers are further configured to receive at least one actual-data signal from the respective electronic circuits, and to compare the actual-data signal to the expected-data, signal.

48. The test bus architecture of claim 47 wherein the test bus is further configured to convey resultant data from the respective controllers to the first test resource as a result of the comparison.

49. The test bus architecture of claim 42 wherein the test bus is further configured to convey resultant data from the respective controllers to the first test resource as a result of accessing the respective ports of the electronic circuits coupleable thereto.

50. A test bus architecture for accessing one or more electronic circuits for testing, debugging, or programmably configuring the electronic circuits, comprising:
   a test bus;
   a first test resource connected to the test bus; and
   a plurality of controllers connected to the test bus, each controller being coupleable to a respective electronic circuit to be accessed,
   wherein the test bus is configured to convey at least one first signal from the first test resource to respective controllers to access, substantially in parallel, the electronic circuits via the respective controllers, and
   wherein the respective controllers are further configured to receive at least one actual-data signal from the respective electronic circuits, and the test bus is further configured to convey at least one mask-data signal from the first test resource to the respective controllers, the mask-data signal being operative to mask at least a portion of the actual-data signal.

51. The test bus architecture of claim 50 wherein the test bus is further configured to convey resultant data from the respective controllers to the first test resource as a result of accessing the respective ports of the electronic circuits coupleable thereto.

52. A test bus architecture for accessing one or more electronic circuits for testing, debugging, or programmably configuring the electronic circuits, comprising:
   a test bus;
   a first test resource connected to the test bus; and
   a plurality of controllers connected to the test bus, each controller being coupleable to a respective electronic circuit to be accessed,
   wherein the test bus is configured to convey at least one first signal from the first test resource to respective controllers to access, substantially in parallel, the electronic circuits via the respective controllers, and
   wherein each controller is configured to provide at least one input-data signal to the respective electronic circuit coupleable thereto, and the test bus is further configured to convey at least one mask-data signal from the first test resource to the controller, the mask-data signal being operative to mask at least a portion of the input-data signal.

53. The test bus architecture of claim 52 wherein the test bus is further configured to convey resultant data from the respective controllers to the first test resource as a result of accessing the respective ports of the electronic circuits coupleable thereto.

54. A test bus architecture for accessing one or more electronic circuits for testing, debugging, or programmably configuring the electronic circuits, comprising:
   a test bus;
   a first test resource connected to the test bus; and
   a plurality of controllers connected to the test bus, each controller being coupleable to a respective electronic circuit to be accessed,
   wherein the test bus is configured to convey at least one first signal from the first test resource to respective controllers to access, substantially in parallel, the electronic circuits via the respective controllers, and
   wherein the test bus is further configured to convey a start signal from the respective controllers to the first test resource, the start signal being operative to indicate to the first test resource that the respective electronic circuits to be accessed are coupled to the controllers, thereby enabling the first test resource to provide the at least one first signal to access, substantially in parallel, the respective ports of the electronic circuits via the respective controllers.

55. A test resource for controlling access to one or more electronic circuits for testing, debugging, or programmably configuring the circuits, comprising:
   a communication interface connectable to a test bus, the test bus being connected to a plurality of controllers, each controller being coupleable to a respective electronic circuit to be accessed; and
   at least one storage device configured to store at least one application for accessing, substantially in parallel, the respective electronic circuits via the plurality of controllers,
   wherein the test resource is configured to execute the at least one application to control the transmission of at least one first signal over the test bus via the communication interface to respective controllers, the respective controllers employing a first protocol to access the electronic circuits coupleable thereto based on the at least one first signal sent over the test bus by the test resource,
   wherein the at least one storage device is configured to store data denoting a plurality of modes for addressing the plurality of controllers, the test resource being configured to execute the at least one application to address at least one of the plurality of controllers according to one of the addressing modes, and
   wherein each controller has an associated address value, and in one of the addressing modes the test resource addresses a single controller based on its associated address value.

56. The test resource of claim 55 wherein the communication interface is compatible with the IEEE 1149.1 test standard.

57. The test resource of claim 55 wherein the at least one storage device is configured to store at least one application for accessing a single electronic circuit by a selected controller, the test resource being configured to execute the at least one application to control the transmission of at least one first signal over the test bus via the communication interface to the selected controller.

58. A test resource for controlling access to one or more electronic circuits for testing, debugging, or programmably configuring the circuits, comprising:
   a communication interface connectable to a test bus, the test bus being connected to a plurality of controllers, each controller being coupleable to a respective electronic circuit to be accessed; and
   at least one storage device configured to store at least one application for accessing, substantially in parallel, the respective electronic circuits via the plurality of controllers,
   wherein the test resource is configured to execute the at least one application to control the transmission of at least one first signal over the test bus via the communication interface to respective controllers, the respective controllers employing a first protocol to access the electronic circuits coupleable thereto based on the at least one first signal sent over the test bus by the test resource,
   wherein the at least one storage device is configured to store data denoting a plurality of modes for addressing the plurality of controllers, the test resource being configured to execute the at least one application to address at least one of the plurality of controllers according to one of the addressing modes, and
   wherein each controller has an associated identification value, and in one of the addressing modes the test resource addresses one or more of the plurality of controllers based on their associated identification values.

59. A test resource for controlling access to one or more electronic circuits for testing, debugging, or programmably configuring the circuits, comprising:
   a communication interface connectable to a test bus, the test bus being connected to plurality of controllers, each controller being coupleable to a respective electronic circuit to be accessed; and
   at least one storage device configured to store at least one application for accessing, substantially in parallel, the respective electronic circuits via the plurality of controllers,
   wherein the test resource is configured to execute the at least one application to control the transmission of at least one first signal over the test bus via the communication interface to respective controllers, the respective controllers employing a first protocol to access the electronic circuits coupleable thereto based on the at least one first signal sent over the test bus by the test resource, wherein the at least one storage device is configured to store data denoting a plurality of modes for addressing the plurality of controllers, the test resource being configured to execute the at least one application to address at least one of the plurality of controllers according to one of the addressing modes, and wherein each controller has an associated group address value, and in one of the addressing modes the test resource addresses respective controllers having the same group address value.

60. A test resource for controlling access to one or more electronic circuits for testing, debugging, or programmably configuring the circuits, comprising:

a communication interface connectable to a test bus, the test bus being connected to a plurality of controllers, each controller being coupleable to a respective electronic circuit to be accessed; and at least one storage device configured to store at least one application for accessing, substantially in parallel, the respective electronic circuits via the plurality of controllers, wherein the test resource is configured to execute the at least one application to control the transmission of at least one first signal over the test bus via the communication interface to respective controllers, the respective controllers employing a first protocol to access the electronic circuits coupleable thereto based on the at least one first signal sent over the test bus by the test resource, wherein the at least one storage device is configured to store data denoting a plurality of modes for addressing the plurality of controllers, the test resource being configured to execute the at least one application to address at least one of the plurality of controllers according to one of the addressing modes, and wherein at least one of the plurality of controllers has an associated alias address value, and in one of the addressing modes the test resource addresses at least one controller based on its associated alias address value.

61. A method of accessing one or more electronic circuits for testing, debugging, or programmably configuring the electronic circuits, comprising the steps of:

providing a first test bus;

providing a first test resource and a plurality of first controllers connected to the first test bus, each first controller being coupleable to a respective electronic circuit to be accessed;

sending at least one first signal over the first test bus to respective first controllers, by the first test resource to access, substantially in parallel, the electronic circuits via the respective first controllers;

employing a first protocol to access the electronic circuits by the respective first controllers based on the at least one first signal sent over the first test bus by the first test resource, and further including the steps of providing a second test bus coupleable to the respective electronic circuits to be accessed and respective second controllers connected to the second test bus and the first controllers, and employing a second protocol to access the respective electronic circuits via the respective second controllers by the first controllers based on at least one second signal sent over the first test bus by the first test resource.

62. A method of accessing one or more electronic circuits for testing, debugging, or programmably configuring the electronic circuits, comprising the steps of:

providing a first test bus;

providing a first test resource and a plurality of first controllers connected to the first test bus, each first controller being coupleable to a respective electronic circuit to be accessed;

sending at least one first signal over the first test bus to respective first controllers by the first test resource to access, substantially in parallel, the electronic circuits via the respective first controllers;

employing a first protocol to access the electronic circuits by the respective first controllers based on the at least one first signal sent over the first test bus by the first test resource, and further including the step of sending at least one expected data signal to the respective first controllers by the first test resource, the expected-data signal being indicative of data expected to be received from the electronic circuits as a result of being accessed by the respective first controllers.

63. The method of claim 62 further including the steps of receiving at least one actual-data signal from the respective electronic circuit as a result of being accessed by the first controller, and comparing the actual-data signal to the expected-data signal by the first controller.

64. The method of claim 63 further including the step of providing resultant data over the test bus to the first test resource as a result of the comparison by the first controller.

65. The method of claim 62 further including the step of providing resultant data over the first test bus to the first test resource as a result of accessing the respective electronic circuits by the respective first controllers.

66. A method of accessing one or more electronic circuits for testing, debugging, or programmably configuring the electronic circuits, comprising the steps of:

providing a first test bus;

providing a first test resource and a plurality of first controllers connected to the first test bus, each first controller being coupleable to a respective electronic circuit to be accessed;

sending at least one first signal over the first test bus to respective first controllers by the first test resource to access, substantially in parallel, the electronic circuits via the respective first controllers;

employing a first protocol to access the electronic circuits by the respective first controllers based on the at least one first signal sent over the first test bus by the first test resource, and further including the steps of receiving at least one actual data signal from the respective electronic circuit as a result of being accessed by the first controller, sending at least one mask-data signal to the respective first controllers by the first test resource, the mask-data signal being operative to mask at least a portion of the actual-data signal.

67. The method of claim 66 further including the step of providing resultant data over the first test bus to the first test resource as a result of accessing the respective electronic circuits by the respective first controllers.

68. A method of accessing one or more electronic circuits for testing, debugging, or programmably configuring the electronic circuits, comprising the steps of:

providing a first test bus;

providing a first test resource and a plurality of first controllers connected to the first test bus, each first controller being coupleable to a respective electronic circuit to be accessed;

sending at least one first signal over the first test bus to respective first controllers by the first test resource to access, substantially in parallel, the electronic circuits via the respective first controllers;

employing a first protocol to access the electronic circuits by the respective first controllers based on the at least one first signal sent over the first test bus by the first test resource, and further including the steps of providing at least one input-data signal to the respective electronic circuit by the first controller, and sending at least one mask-data signal to the first controller by the first test resource, the mask-data signal being operative to mask at least a portion of the input-data signal.

69. The method of claim 68 further including the step of providing resultant data over the first test bus to the first test resource as a result of accessing the respective electronic circuits by the respective first controllers.

70. A method of accessing one or more electronic circuits for testing, debugging, or programmably configuring the electronic circuits, comprising the steps of:

providing a first test bus;

providing a first test resource and a plurality of first controllers connected to the first test bus, each first controller being coupleable to a respective electronic circuit to be accessed;

sending at least one first signal over the first test bus to respective first controllers by the first test resource to access, substantially in parallel, the electronic circuits via the respective first controllers;

employing a first protocol to access the electronic circuits by the respective first controllers based on the at least one first signal sent over the first test bus by the first test resource, and wherein the first providing step includes providing a plurality of test buses, and the second providing step includes providing respective pluralities of first controllers connected to the test buses, and further including the step of successively interconnecting the test buses by at least one bus bridge.

71. The method of claim 70 wherein the step of successively interconnecting the test buses includes interconnecting a first test bus and a second test bus by the bus bridge, the first test bus being a source bus.

72. The method of claim 70 wherein the step of successively interconnecting the test buses includes interconnecting a first test bus and a second test bus by the bus bridge, each of the first and second test buses being configured to convey test data, and further including the step of conveying the test data between the first test bus and the second test bus over the bus bridge.

73. A test bus architecture, comprising:

a plurality of test buses; and at least one test bus bridge interconnecting the plurality of test buses, each test bus bridge interconnecting a respective pair of test buses, wherein each test bus bridge is configured to convey test data between a first test bus and a second test bus, wherein each test bus bridge includes a plurality of registers including at least one first register and at least one second register, the first register being communicably coupled to the first test bus, the second register being communicably coupled to the second test bus, the first and second registers being communicably coupled to one another to allow test data to be conveyed between the first and second test buses via the first and second registers, and wherein the first register is clocked by a first clock signal and the second register is clocked by a second clock signal.

74. The test bus architecture of claim 73 wherein the at least one test bus bridge is addressable.

75. The test bus architecture of claim 73 wherein the second clock signal is a delayed version of the first clock signal.

* * * * *

UNITED STATES PATENT AND TRADEMARK OFFICE
CERTIFICATE OF CORRECTION

PATENT NO.         : 6,988,232 B2  
APPLICATION NO.    : 10/119060  
DATED              : January 17, 2006  
INVENTOR(S)        : Michael Ricchetti et al.

It is certified that error appears in the above-identified patent and that said Letters Patent is hereby corrected as shown below:

Column 9, line 36, "UUT ID" should read --UUT_ID--;

Column 12, line 47, "DIO_OUT" should read --DIO_UUT--;

Column 12, line 66, "TDI UUT" should read --TDI_UUT--;

Column 16, line 37, "Select ATL" should read --Select_ATL--;

Column 17, line 16, "SO" should read --so--;

Column 31, claim 5, line 40, "coup leable" should read --coupleable--; and

Column 32, claim 18, line 60, "connect6d" should read --connected--.

Signed and Sealed this

Twenty-fifth Day of July, 2006

JON W. DUDAS  
*Director of the United States Patent and Trademark Office*